United States Patent
Nobunaga et al.

(10) Patent No.: US 6,507,525 B1
(45) Date of Patent: Jan. 14, 2003

(54) DIFFERENTIAL SENSING IN A MEMORY

(75) Inventors: Dean Nobunaga, Sunnyvale; Frankie F. Roohparvar, Miltitas, both of CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/648,723

(22) Filed: Aug. 25, 2000

(51) Int. Cl.[7] ................................................. G11C 7/00
(52) U.S. Cl. .............. 365/203; 365/185.25; 365/189.11
(58) Field of Search ....................... 365/189.01, 230.01, 365/201, 203, 185.25, 189.11

(56) References Cited

U.S. PATENT DOCUMENTS

| | | |
|---|---|---|
| 5,041,886 A | 8/1991 | Lee |
| 5,446,690 A | 8/1995 | Tanaka et al. |
| 5,537,354 A | 7/1996 | Mochizuki et al. |
| 5,600,605 A | 2/1997 | Schaefer |
| 5,623,450 A * | 4/1997 | Phillips et al. ............... 365/203 |
| 5,661,690 A | 8/1997 | Roohparvar |
| 5,666,321 A | 9/1997 | Schaefer |
| 5,751,039 A | 5/1998 | Kauffman et al. |
| 5,754,469 A * | 5/1998 | Hung et al. ............. 365/185.03 |
| 5,787,457 A | 7/1998 | Miller et al. |
| 5,936,903 A | 8/1999 | Jeng et al. |
| 5,963,486 A * | 10/1999 | Yeung et al. ................ 365/190 |
| 5,995,438 A | 11/1999 | Jeng et al. |
| 6,026,465 A | 2/2000 | Mills et al. |
| 6,078,523 A | 6/2000 | Pascucci |
| 6,137,133 A | 10/2000 | Kauffman et al. |
| 6,141,247 A | 10/2000 | Roohparvar et al. |
| 6,144,600 A | 11/2000 | Ogura |
| 6,282,137 B1 | 8/2001 | Lee et al. |
| 6,301,176 B1 | 10/2001 | Brown |
| 6,310,809 B1 * | 10/2001 | Roohparvar et al. ......... 365/203 |
| 6,327,202 B1 * | 12/2001 | Roohparvar ................. 365/203 |

OTHER PUBLICATIONS

Keeth, et al., "DRAM circuit design: a tutorial," IEEE Press, 2001, pp.16–23, 142–153.
Micron Semiconductor Products, Inc., "2Mb, Smart 5 BIOS–Optimized Boot Block Flash Memory," *Flash Memory* www.micron.com, copyright 2000, Micron Technology, Inc., pp. 1–12.
Micron, "16 Mb: x16 SDRAM" *Synchronous DRAM*, www.micron.com, copyright 1999 Micron Technology, Inc., pp. 1–51.

* cited by examiner

*Primary Examiner*—Richard Elms
*Assistant Examiner*—Tuan T. Nguyen
(74) *Attorney, Agent, or Firm*—Leffert Jay & Polglaze P.A.

(57) ABSTRACT

A memory device can read data stored in memory cells using a differential voltage sensing technique. The memory includes a differential voltage sensing circuit having two input nodes. The nodes of the sensing circuit are pre-charged to different initial voltage levels prior to reading the memory cell. The nodes are pre-charged by charge sharing multiple bit lines. A selected node that is coupled to a memory cell to be read is pre-charged to a higher value than the second sensing node. After a word line coupled to the memory cell is activated, the initial differential voltage between the sensing nodes will remain if the memory cell is programmed such that it does not conduct current in response to the word line signal. If the memory cell is not programmed, the memory cell will discharge the selected sensing node to provide a different differential voltage to be sensed.

31 Claims, 25 Drawing Sheets

| Selected Local Bit Line | Block Pass transistor (BlkP) | | | | | | | | | | | | | | | |
|---|---|---|---|---|---|---|---|---|---|---|---|---|---|---|---|---|
| | 00 | 01 | 02 | 03 | 10 | 11 | 12 | 13 | 20 | 21 | 22 | 23 | 30 | 31 | 32 | 33 |
| 00 | X | | | | X | | | | X | X | | | X | X | | |
| 01 | | X | | | | X | | | X | X | | | X | X | | |
| 02 | | | X | | | | X | | | | X | X | | | X | X |
| 03 | | | | X | | | | X | | | X | X | | | X | X |
| 10 | X | | | | X | | | | X | X | | | X | X | | |
| 11 | | X | | | | X | | | X | X | | | X | X | | |
| 12 | | | X | | | | X | | | | X | X | | | X | X |
| 13 | | | | X | | | | X | | | X | X | | | X | X |
| 20 | X | X | | | X | X | | | X | | | | X | | | |
| 21 | X | X | | | X | X | | | | X | | | | X | | |
| 22 | | | X | X | | | X | X | | | X | | | | X | |
| 23 | | | X | X | | | X | X | | | | X | | | | X |
| 30 | X | X | | | X | X | | | X | | | | X | | | |
| 31 | X | X | | | X | X | | | | X | | | | X | | |
| 32 | | | X | X | | | X | X | | | X | | | | X | |
| 33 | | | X | X | | | X | X | | | | X | | | | X |

*Fig. 4*

| Selected Local Bit Line | Block Pass transistor (BlkP) | | | | | | | | | | | | | | | |
|---|---|---|---|---|---|---|---|---|---|---|---|---|---|---|---|---|
| | 00 | 01 | 02 | 03 | 10 | 11 | 12 | 13 | 20 | 21 | 22 | 23 | 30 | 31 | 32 | 33 |
| 00 | X | | | | X | | | | X | | | | X | | | |
| 01 | | X | | | | X | | | | X | | | | X | | |
| 02 | | | X | | | | X | | | | X | | | | X | |
| 03 | | | | X | | | | X | | | | X | | | | X |
| 10 | X | | | | X | | | | X | | | | X | | | |
| 11 | | X | | | | X | | | | X | | | | X | | |
| 12 | | | X | | | | X | | | | X | | | | X | |
| 13 | | | | X | | | | X | | | | X | | | | X |
| 20 | X | | | | X | | | | X | | | | X | | | |
| 21 | | X | | | | X | | | | X | | | | X | | |
| 22 | | | X | | | | X | | | | X | | | | X | |
| 23 | | | | X | | | | X | | | | X | | | | X |
| 30 | X | | | | X | | | | X | | | | X | | | |
| 31 | | X | | | | X | | | | X | | | | X | | |
| 32 | | | X | | | | X | | | | X | | | | X | |
| 33 | | | | X | | | | X | | | | X | | | | X |

*Fig. 5*

| Selected Local Bit Line | Block Pass transistor (BlkP) | | | | | | | | | | | | | | |
|---|---|---|---|---|---|---|---|---|---|---|---|---|---|---|---|
| | 00 | 01 | 02 | 03 | 10 | 11 | 12 | 13 | 20 | 21 | 22 | 23 | 30 | 31 | 32 | 33 |
| 00 | X | | | | X | | | | | | | | | | | |
| 01 | | X | | | | X | | | | | | | | | | |
| 02 | | | X | | | | X | | | | | | | | | |
| 03 | | | | X | | | | X | | | | | | | | |
| 10 | X | | | | X | | | | | | | | | | | |
| 11 | | X | | | | X | | | | | | | | | | |
| 12 | | | X | | | | X | | | | | | | | | |
| 13 | | | | X | | | | X | | | | | | | | |
| 20 | | | | | | | | | X | | | | X | | | |
| 21 | | | | | | | | | | X | | | | X | | |
| 22 | | | | | | | | | | | X | | | | X | |
| 23 | | | | | | | | | | | | X | | | | X |
| 30 | | | | | | | | | X | | | | X | | | |
| 31 | | | | | | | | | | X | | | | X | | |
| 32 | | | | | | | | | | | X | | | | X | |
| 33 | | | | | | | | | | | | X | | | | X |

DIFFERENTIAL SENSING IN A MEMORY

TECHNICAL FIELD OF THE INVENTION

The present invention relates generally to memory devices and in particular the present invention relates to reading data from memory devices.

BACKGROUND OF THE INVENTION

Memory devices are typically provided as internal storage areas in a computer, or processing system. The term memory identifies data storage that comes in the form of integrated circuit chips. There are several-different types of memory. One type is RAM (random-access memory). This is typically used as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Dynamic random access memories (DRAMs) are data storage devices that store data as a charge on a storage capacitor. A DRAM typically includes an array of memory cells that each include a storage capacitor and an access transistor for transferring charge to and from the storage capacitor. Each memory cell is addressed by a word line and accessed by a bit line. The word line controls the access transistor such that the access transistor controllably couples and decouples the storage capacitor to and from the bit line for writing and reading data to and from the memory cell. The data is read using a differential sensing circuit.

In a typical DRAM complementary bit lines are coupled to a differential sense amplifier. During operation, the bit lines are precharged and equilibrated to a common intermediate voltage. It is common to precharge the bit lines to ½ VCC prior to accessing a memory cell. The memory cell is then coupled to one of the bit lines and changes the voltage of the bit line. That is, the charge or lack of charge stored on the memory cell is shared with the charged bit line. The resultant charge will either be increased by a memory cell having a charge, or decreased by an unprogrammed memory cell. The differential voltage level between the complementary bit lines can then be detected and the respective bit lines amplified to either VCC or VSS.

The differential sensing scheme of the DRAM is fast and does not consume an unacceptable level of power. As such, differential sensing is used in different types of DRAM's, including synchronous dynamic random access memory (SDRAM). An SDRAM is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAM's can be accessed quickly, but are volatile. Many computer systems are designed to operate using SDRAM, but would benefit from non-volatile memory.

Computers often contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM.

EEPROM comprise a large number of memory cells having electrically isolated gates (floating gates). Data is stored in the memory cells in the form of charge on the floating gates. Charge is transported to or removed from the floating gates by programming and erase operations, respectively.

Another type of non-volatile memory is a Flash memory. A Flash memory is a type of EEPROM that can be erased and reprogrammed in blocks instead of one byte at a time. A typical flash memory cell is fabricated in an integrated circuit substrate and includes a source region and a drain region that is spaced apart from the source region to form an intermediate channel region. A floating gate, typically made of doped polysilicon, is disposed over the channel region and is electrically isolated from the other cell elements by oxide. For example, gate oxide can be formed between the floating gate and the channel region. A control gate is located over the floating gate and can also be made of doped polysilicon. The control gate is electrically separated from the floating gate by another dielectric layer. Thus, the floating gate is "floating" in dielectric so that it is insulated from both the channel and the control gate.

Table 1 shows example approaches to programming, reading and erasing (two approaches) of a flash memory cell. The voltages are based upon the assumption that the primary supply voltage VCC for the memory is +5 volts. The conditions for programming call for the application of a high positive gate voltage Vg, such as +12 volts, a moderate positive drain voltage Vd of +6 to +9 volts, and the source voltage Vs and the substrate voltage Vsub are held at ground level.

TABLE I

|  | PROGRAM | READ | ERASE 1 | ERASE 2 |
| --- | --- | --- | --- | --- |
| Control Gate (Vg) | +12 | +5 | Ground | −10 to −17 |
| Drain (Vd) | +6 to +9 | +1 | Float | Float |
| Source (Vs) | Ground | Ground | +12 | +5 |
| Substrate (Vsub) | Ground | Ground | Ground | Ground |

The above conditions result in the inducement of hot electron injection in the channel region near the drain region of the memory cell. These high-energy electrons travel through the gate oxide towards the positive voltage present on the control gate and collect on the floating gate. These electrons remain on the floating gate and function to reduce the effective threshold voltage of the cell as compared to a cell which has not been programmed.

Table 1 also shows the conditions for reading the memory cell. Here, the control gate voltage Vg is connected to the primary supply voltage VCC of +5 volts. In addition, the drain voltage Vd is set to a small positive voltage of +1 volts and the source voltage Vs is set to ground potential. If the cell were in a programmed state, the excess electrons present on the floating gate would have increased the threshold voltage to a value in excess of +5 volts. Thus, the control gate Vg to source voltage Vs of +5 volts would not be sufficient to turn on the memory cell. That is, current would not be conducted through the channel region. The resultant lack of cell current would indicate that the memory cell was in a programmed state. If the memory cell were in an erased state, the threshold voltage of the cell would be substantially below +5 volts. In that case, the cell would conduct current in response to the control gate voltage that would be sensed to indicate that the cell was in the erased state.

Two exemplary conventional alternative sets of conditions for erasing a flash cell are shown in Table 1. In the first example, the control gate voltage Vg is grounded and the drain region is left floating (open), and the source region voltage Vs is connected to a large positive voltage of +12 volts. When these conditions are applied to the cell, a strong electric field is generated between the floating gate and the source region. This field causes the electrons on the floating gate to be transferred to the source region by way of Fowler-Nordheim tunneling, sometimes called cold electron injection.

The above conditions for erasing a cell have been viewed by others as disadvantageous in that the large positive voltage (+12 volts) applied to the source region is difficult to implement in an actual memory system. In another approach, a relatively large negative voltage ranging from −10 to −17 volts is applied to the gate during an erase operation. In addition, the primary supply voltage VCC of +5 volts (or less) is applied to the source region while the drain region is left floating.

In contrast to dynamic memory cells, a floating gate memory cell is typically read using a reference cell current. That is, a reference non-volatile memory cell is coupled to a current sensing circuit via a reference bit line. The read memory cell is coupled to the sensing circuitry via a second bit line. A differential current between the two bit lines is detected, and the programmed state of the memory cell is determined. The reference cell is typically programmed to an intermediate state such that it conducts about ½ the current conducted by a fully programmed memory cell.

While the current sensing technique using a reference current cell is effective for reading a small number of memory cells at one time, such as 8, 16 or 32 cells, the overhead involved in implementing this technique to simultaneous read a page of memory cells (e.g. 4 k memory cells) is too large. Further, maintaining the accuracy of the reference cell currents for reading a large number of cells is difficult, the speed of a current sensing technique is less than desirable, and the power consumption can be prohibitive.

For the reasons stated above, and for other reasons stated below which will become apparent to those skilled in the art upon reading and understanding the present specification, there is a need in the art for a different method of reading data from memory cells.

SUMMARY OF THE INVENTION

The above-mentioned problems with non-volatile memory devices and other problems are addressed by the present invention and will be understood by reading and studying the following specification.

A memory, in one embodiment, includes an array of memory cells, a differential voltage sensing circuit having first and second sensing nodes couplable to the array, and pre-charge circuitry to provide a first pre-charge voltage level on the first sensing node while providing a second pre-charge voltage level on the second sensing node. The memory can further include local bit lines coupled to the array of memory cells and global bit lines coupled to the first and second sensing nodes. Selectively controllable pass circuitry is coupled to the local bit lines and the global bit lines to selectively couple one or more local bit lines to the global bit lines. Pre-charge circuitry can include pull-down circuitry to discharge the local bit lines, and pull-up circuitry to charge the global bit lines. Control circuitry is used to selectively couple a first pre-defined number of local bit lines to a first global bit line, and selectively couple a second pre-defined number of local bit lines to a second global bit line, wherein the second pre-defined number of local bit lines is less than the first pre-defined number.

In another embodiment, a method of operating a memory device is provided. The method includes pre-charging a first sensing node of a differential voltage sensing circuit to a first voltage level and pre-charging a second sensing node of the differential voltage sensing circuit to a second voltage level that is less than the first voltage level. A read signal is provided to a memory cell coupled to the first sensing node, and the first sensing node is discharged to a third voltage level that is less than the second voltage level if the memory cell is not programmed.

In one embodiment, pre-charging the first sensing node comprises coupling a first bit line charged to a first potential, such as Vcc, to a group of second bit lines at a second potential, such as Vss. Pre-charging the second sensing node comprises coupling a third bit line charged the first potential to a group of fourth bit lines at the second potential, wherein the group of fourth bit lines is less than the group of second bit lines.

BRIEF DESCRIPTION OF THE DRAWINGS

FIG. 4 illustrates a pass transistor activation pattern for one embodiment of the present invention;

FIG. 5 illustrates another pass transistor activation pattern for one embodiment of the present invention;

FIG. 6 illustrates yet another pass transistor activation pattern for one embodiment of the present invention;

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention addresses data read operations in a non-volatile memory device. The circuits and methods described herein help provide fast simultaneous data reads of multiple columns of non-volatile memory cells. This could allow the non-volatile memory device to operate within the established access times of a SDRAM. Prior to describing the memory array architecture and operating methods, a general description of one embodiment of a flash memory of the present invention is described.

Figure 1:
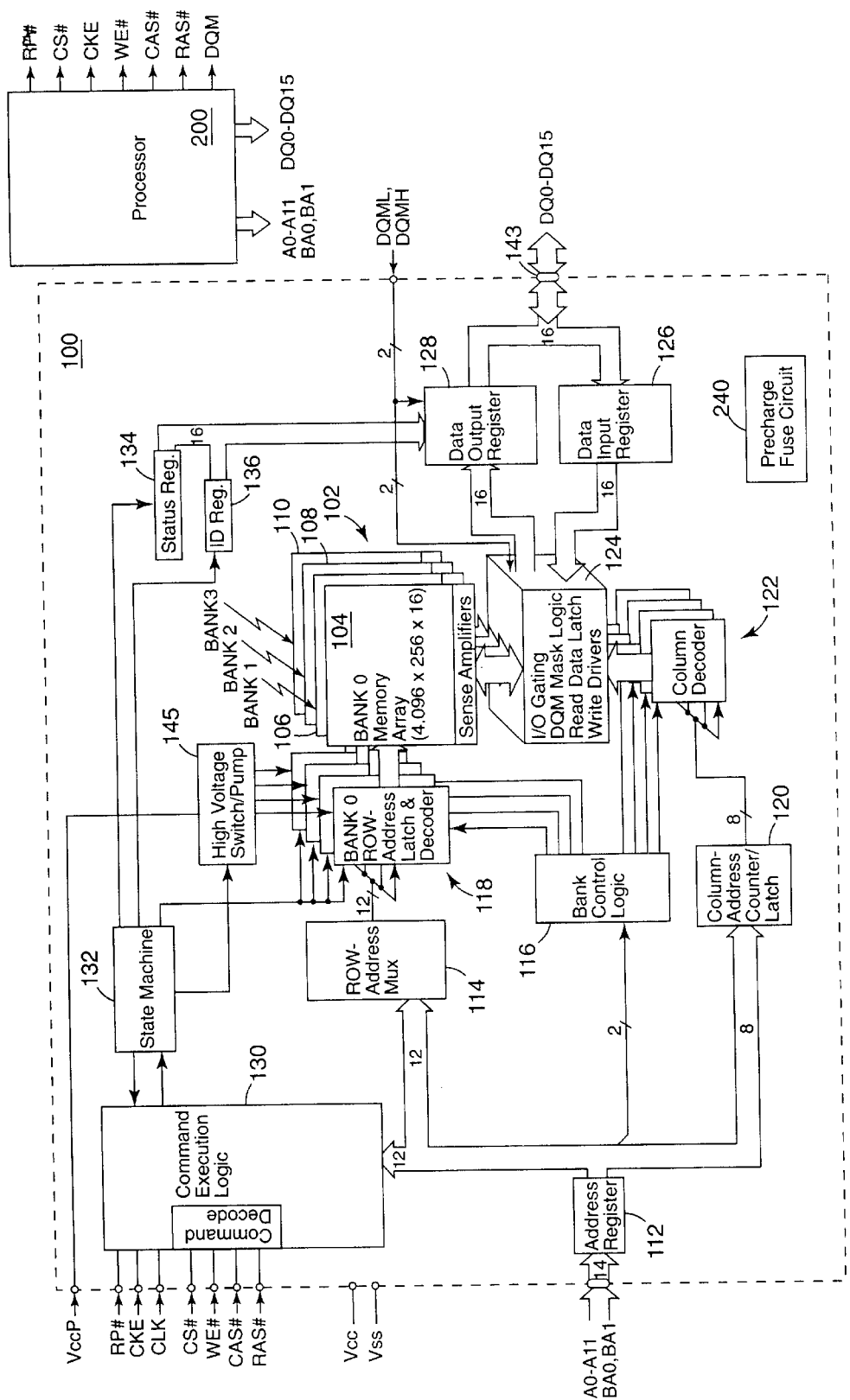
FIG. 1 is a block diagram of a non-volatile memory device according to one embodiment of the present invention.

Referring to FIG. 1, a block diagram of one embodiment of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 from processor 200. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128. Command execution logic 130 is provided to control the basic operations of the memory device including memory read operations. A state machine 132 is also provided to control specific operations performed on the memory arrays and cells. A high voltage switch and pump circuit 145 is provided to supply higher voltages during erase and write operations. A status register 134 and an identification register 136 can also be provided to output data. The memory can be coupled to an external memory controller, or processor 200, to receive commands such as read, write and erase command. Other memory command can be provided, but are not necessary to understand the present invention and are therefore not outlined herein. The memory includes power supply inputs Vcc and Vss to receive lower and upper voltage supply potentials. It will be appreciated that Vcc does not have to be an externally provided potential, but could be any positive potential available in the memory device.

Figure 2:
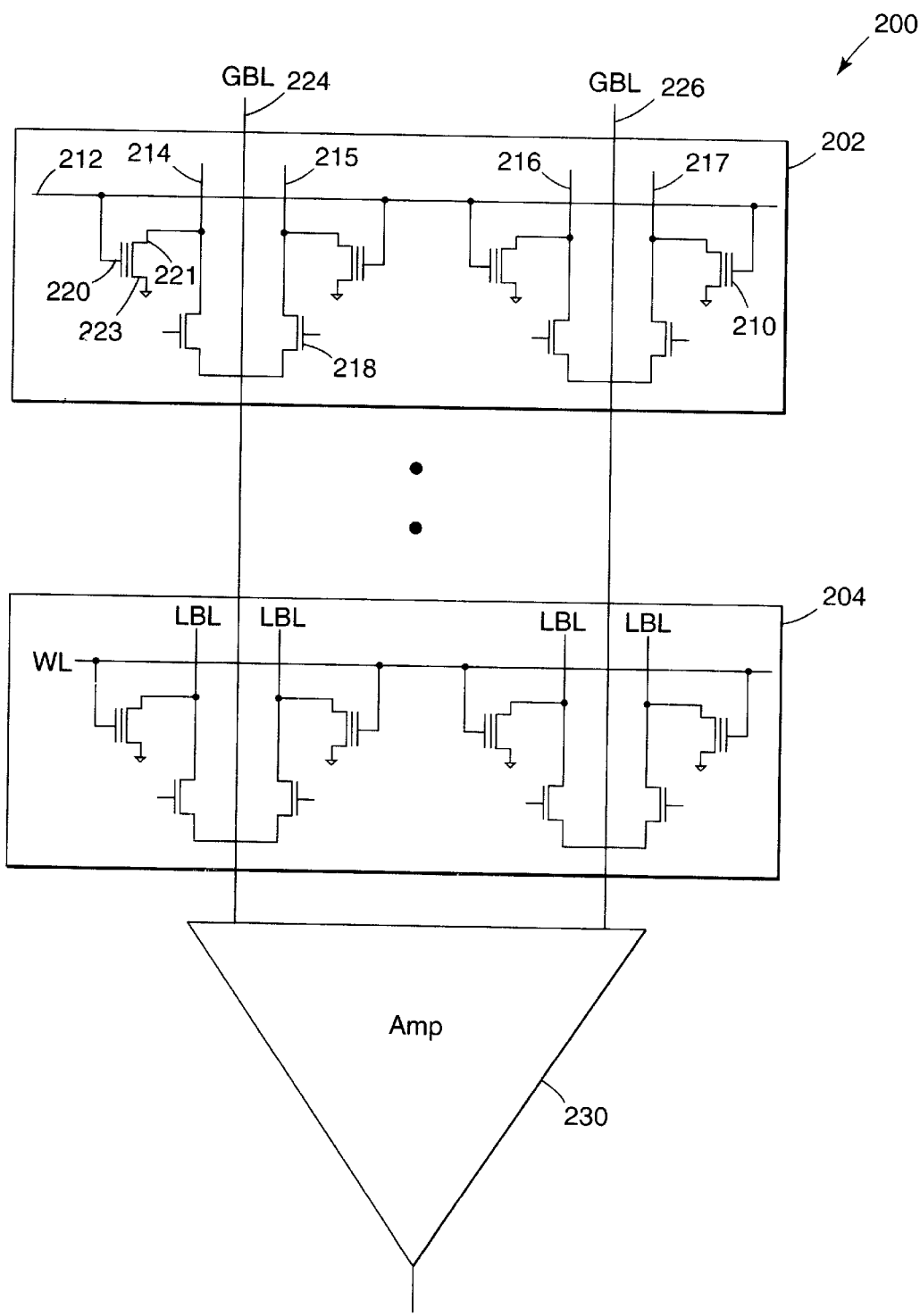
FIG. 2 is a simplified schematic diagram of a portion of a non-volatile memory array.

As explained above, the array can be arranged in a plurality of addressable banks. Referring to FIG. 2, a simplified schematic diagram of one bank 200 of a memory array is described. Each bank of the memory array can be divided into numerous blocks 202 and 204 of non-volatile memory cells 210. Each block of cells can be erased during a common erase operation. The memory cells in the blocks are arranged in rows and columns, similar to a DRAM. The rows are defined by word lines 212 coupled to the control gates 220 of the non-volatile memory cells 210. Local bit lines 214–217 coupled to the drain regions of the memory cells define the columns of the memory array.

Pass transistors 218, or gates, are coupled between the local bit lines 214–217 and global bit lines 224 and 226 that traverse the blocks 202 and 204 of the memory array bank. That is, local bit lines of the numerous banks can be selectively coupled to a global bit line via the pass transistors 218. Two global bit lines 224 and 226 are coupled to a common differential sense amplifier 230. This sense amplifier detects a voltage differential between the two global bit lines, as explained below. The terms global bit line and local bit line have been selected herein to indicate different capacitive data communication paths that are located between a memory cell 210 and a sensing circuit 230. The data paths can be selectively isolated from each other or coupled together to form a common path/capacitance. Embodiments of the present invention use the capacitive features of the bit lines to improve read operations of a non-volatile memory. Those skilled in the art, with the benefit of the present description, will understand that the terms global and local bit lines can be substituted without departing from the present invention. Further, global and local should not be taken in a limiting manner to restrict the bit lines to a physical location within the memory device.

A capacitance of both the global bit lines and the local bit lines can be fabricated so that they are substantially equal. As known to those skilled in the art, capacitors coupled in parallel result in a combined capacitance that is a sum of the individual capacitors. Thus, coupling a global bit line with a local bit line results in a combined capacitance that has twice the capacitance level of the global bit line. If the global bit line held a charge that resulted in a global bit line voltage of Vcc, charge sharing the global bit line with a discharged local bit line results in a voltage on the local and global bit lines of Vcc/2.

The present invention uses the principle of capacitive charge sharing to establish pre-charge values for the global bit lines in the non-volatile memory. In one embodiment, the global bit lines are charged to a voltage level of Vcc and the local bit lines are discharged to Vss, or ground. In operation, a pre-selected number of local bit lines are coupled to the global bit lines to establish a pre-charge voltage level. That is, to achieve a pre-charge voltage level of Vcc/2, a single discharged local bit line is coupled to a charged global bit line. Because the capacitances of the global and local bit lines are substantially equal, the resultant voltage level is Vcc/2. Likewise, two local discharged bit lines can be coupled to one charged global bit line to obtain a pre-charge voltage of Vcc/3. It will be appreciated by those skilled in the art with the benefit of the present description that the capacitive ratio of the local bit lines to the global bit lines can change and the present invention is not limited to global bit lines and local bit lines that have substantially the same capacitance. In one embodiment, the present invention provides a non-volatile memory that uses global and local bit lines to establish a pre-charge voltage level for the bit lines. Different sensing techniques are described herein for reading data from the array of non-volatile memory cells.

As explained above, the memory has a plurality of memory array banks 104, 106, 108 and 110 and the memory array of each bank is divided into addressable blocks 202 and 204. In each block, numerous memory cells 210 are connected together through their drain connections 221 to local bit lines (LBL) 214–217. The local bit lines can be selectively coupled to global bit lines (GBL) 224 and 226 through block pass transistors 228, or switches. Each pair of global bit lines are coupled to the input nodes of a sense amplifier 230. The non-volatile memory cells are floating gate, or stacked gate, transistors that have a source region 223 coupled to ground, Vss.

During a read operation, the global bit lines are pre-charged to a predetermined fraction of the Vcc voltage level. The number of discharged local bit lines coupled to a charged global bit line using the block pass transistors establishes this fractional voltage level. The number and combination of block pass transistors 218 that are activated is controlled using programmable fuses 240 (FIG. 1), such as a group of floating gate transistors. By using programmable fuses, the pre-charge voltage level can be adjusted, or tuned, after the memory is manufactured to compensate for manufacturing variables. Thus, costly integrated circuit mask changes are not necessary to change the pre-charge voltage level.

Figure 3:
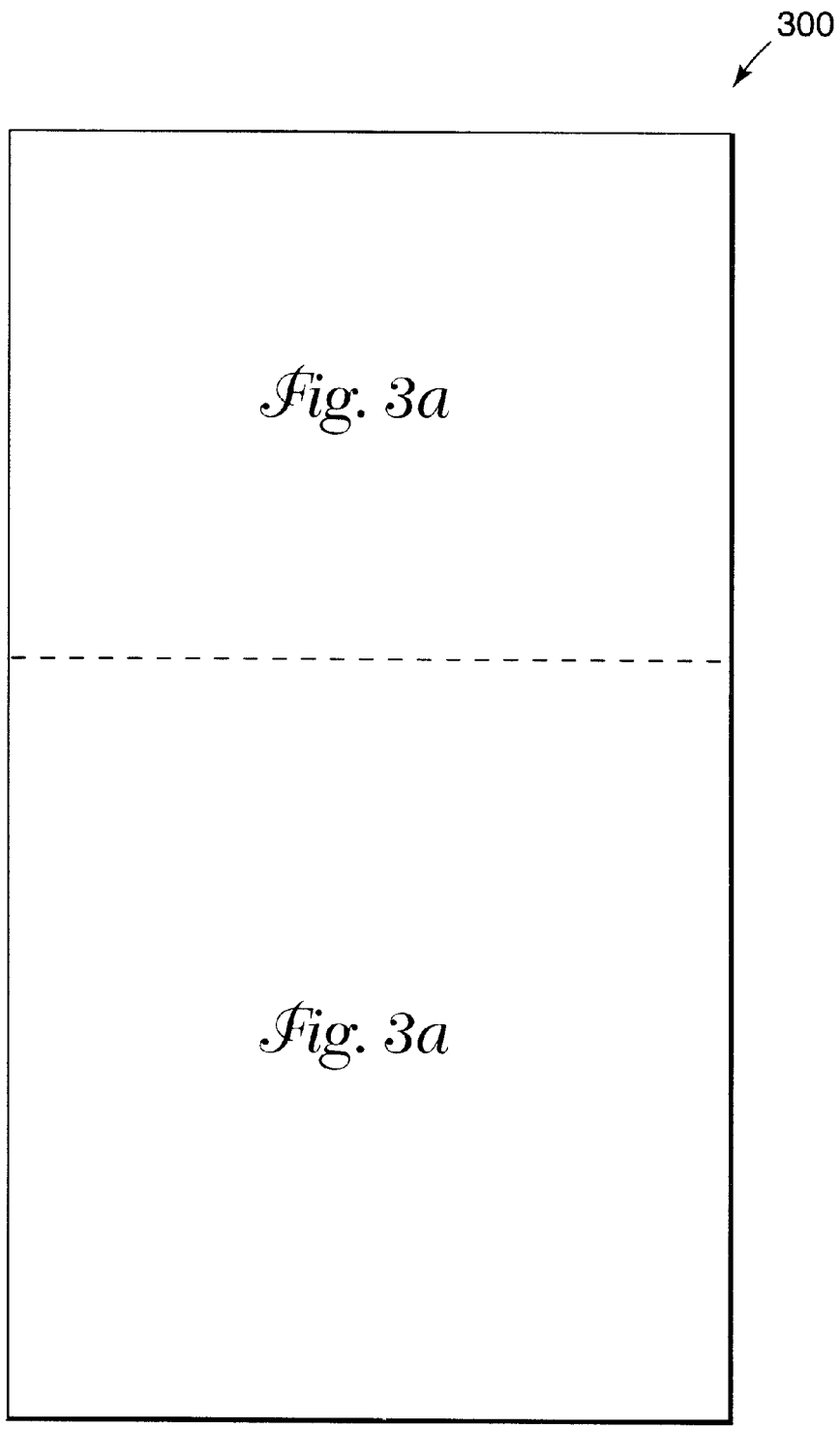
FIG. 3 is another simplified schematic diagram of a portion of a non-volatile memory array.
Figure 3A:
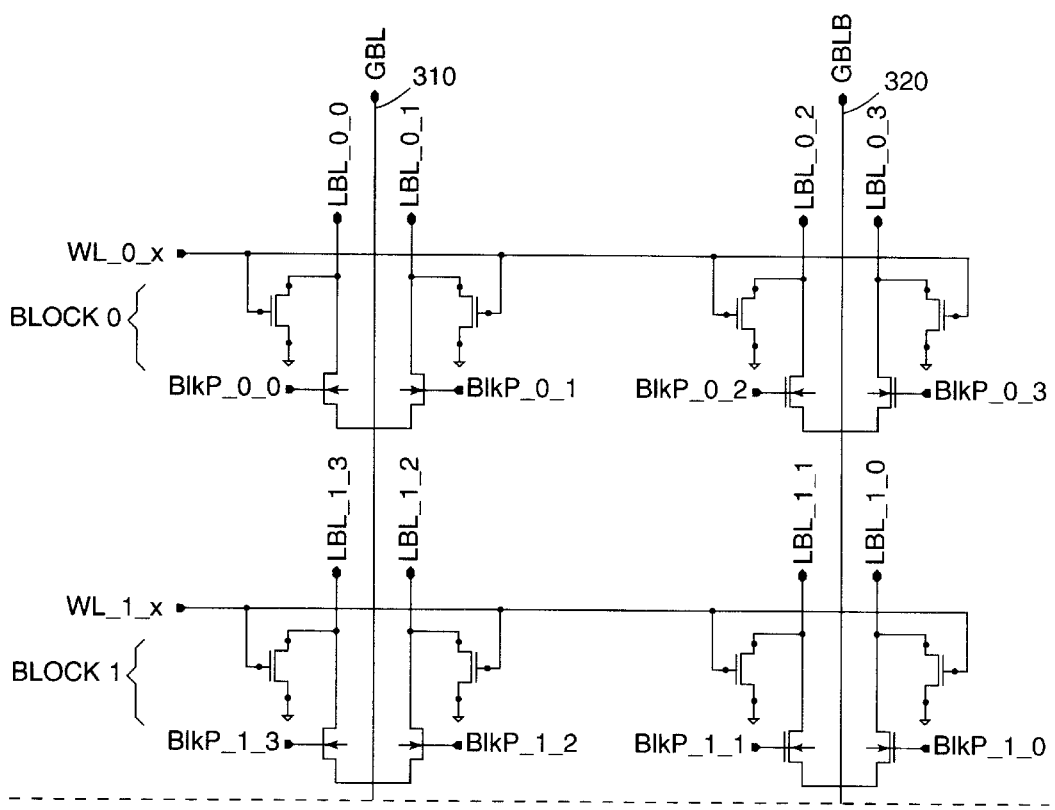
Figure 3B:
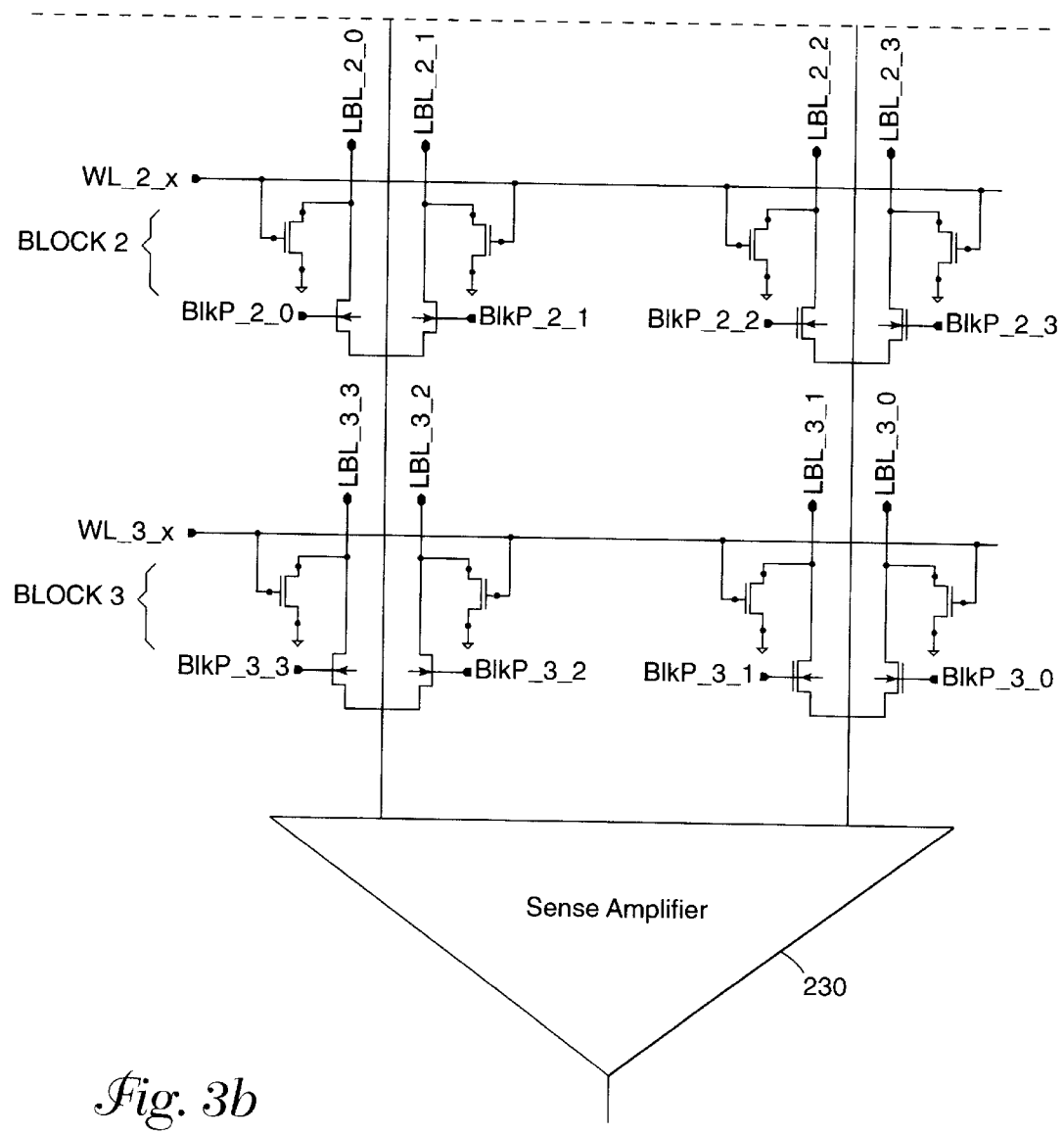

Referring to FIG. 3, a portion of a memory array 300 having two global bit lines 310 and 320 is illustrated. The array includes four addressable blocks (Block 0–3) that each includes memory cells coupled to local bit lines (LBL00–LBL33). For simplicity, FIG. 3 illustrates four memory array blocks that each contain four local bit lines. Each local bit line is illustrated as coupled to one floating gate memory cell 210. It will be understood, however, that numerous memory cells can be coupled to each local bit line. The memory cells have a control gate that is coupled to a word line (WL0–3). Four word lines are illustrated in FIG. 3 that correspond to the four array blocks. Again, numerous word lines can be provided in each block, but for clarity of describing the present invention only one word line is illustrated for each block.

As explained above, the memory control circuit 130 and programmable fuses 240 control the number of local bit lines coupled to a global bit line. Further, to achieve a pre-charge voltage of Vcc/4, Vcc/3 or Vcc/2 the global bit lines are coupled to 3, 2 or 1 local bit lines, respectively. Embodiments of the present invention are illustrated in FIGS. 4–6 for each of these pre-charge levels. The local bit lines are coupled to the global bit lines in response to the selected local bit line that contains the memory cell to be read. For example, if a memory cell coupled to local bit line 00 is to be read, block pass transistors 00, 10, 20, 21, 30 and 31 are activated to couple three local bit lines to each global bit line, see FIG. 4. The resultant pre-charge voltage is then Vcc/4. For Vcc/3, block pass transistors 00, 10, 20 and 30 are activated, see FIG. 5. For Vcc/2, block pass transistors 00 and 10 are activated, FIG. 6. The block pass patterns illustrated in FIGS. 5 each contain a common pattern shown in FIG. 6. Likewise, FIG. 4 contains the pattern of FIG. 5. Further, only one block pass transistor is activated in the block containing the selected local bit line. The above described and illustrated patterns are merely representative of possible activation sequences that can be configured using the fuse circuitry. The number of local bit lines implemented in a memory device, however, may differ from four and the actual implemented pattern may be different. FIGS. 3–6 have been provided to illustrate that a first group of bit lines having a first charge can be selectively coupled to second bit lines having a second charge to control sense amplifier voltages. The illustrated example charge shares local bit lines at Vss with global bit lines at Vcc.

Data stored on a floating gate non-volatile memory cell can be disturbed if the cell drain voltage is too high. This problem is referred to as drain disturb. To avoid drain disturb problems with the non-volatile memory cells, therefore, the drain voltage of the memory cells must be maintained below an allowed maximum voltage. One embodiment of the present invention allows the bit line voltage that is coupled to the memory cell drain region to be adjusted, as explained below.

Changes in local and global bit line capacitances and cell currents due to process or layout variations can affect bit line sense amplifier operating margin. That is, variations in the bit line capacitances affect the charge shared voltage level, and variations in cell current affect the differential input voltage that is established. Using the adjustable bit line pre-charge scheme described above, the sensing margin of the sense amplifier circuit can be maximized by adjusting the pre-charge voltage and adjusting the timing of the sensing circuits, as described in detail below. Changing pre-charge levels is relatively easy using the programmable fuse circuit 240. It is noted that the above described block pass transistor patterns in FIGS. 4–6 are not exhaustive and other embodiments of the present invention are contemplated.

Differential Voltage Sensing Technique

As described above, dynamic memory devices use differential voltage sensing techniques to read data stored on capacitive memory cells. Differential data lines, or bit lines, are typically equilibrated to a common voltage level that is between the two voltage levels stored on the memory cell, Vcc and Vss. During reading operations a memory cell is coupled to one of the differential lines and changes the voltage of that line through charge sharing. The resultant differential voltage between the two data lines can then be sensed by a differential sensing circuit. This technique allows dynamic data to be sensed and restores the dynamic memory cell to its pre-read state. Further, the differential technique of the dynamic memory provides a fast reading method.

Non-volatile memory cells, however, store data in a different manner and cannot be sensed using the charge sharing techniques of the dynamic memory devices. Typical methods and circuits for reading floating gate memory cells include detecting a current differential between a reference current and a current conducted by a memory cell being read. While this technique is effective, it is more time consuming than the differential voltage method of the dynamic memories. Further, the traditional non-volatile memory reading techniques are not well suited for fast data reading and require significant current consumption to read a large number of memory cells simultaneously.

Figures 7, 7A, 7B, 7C:
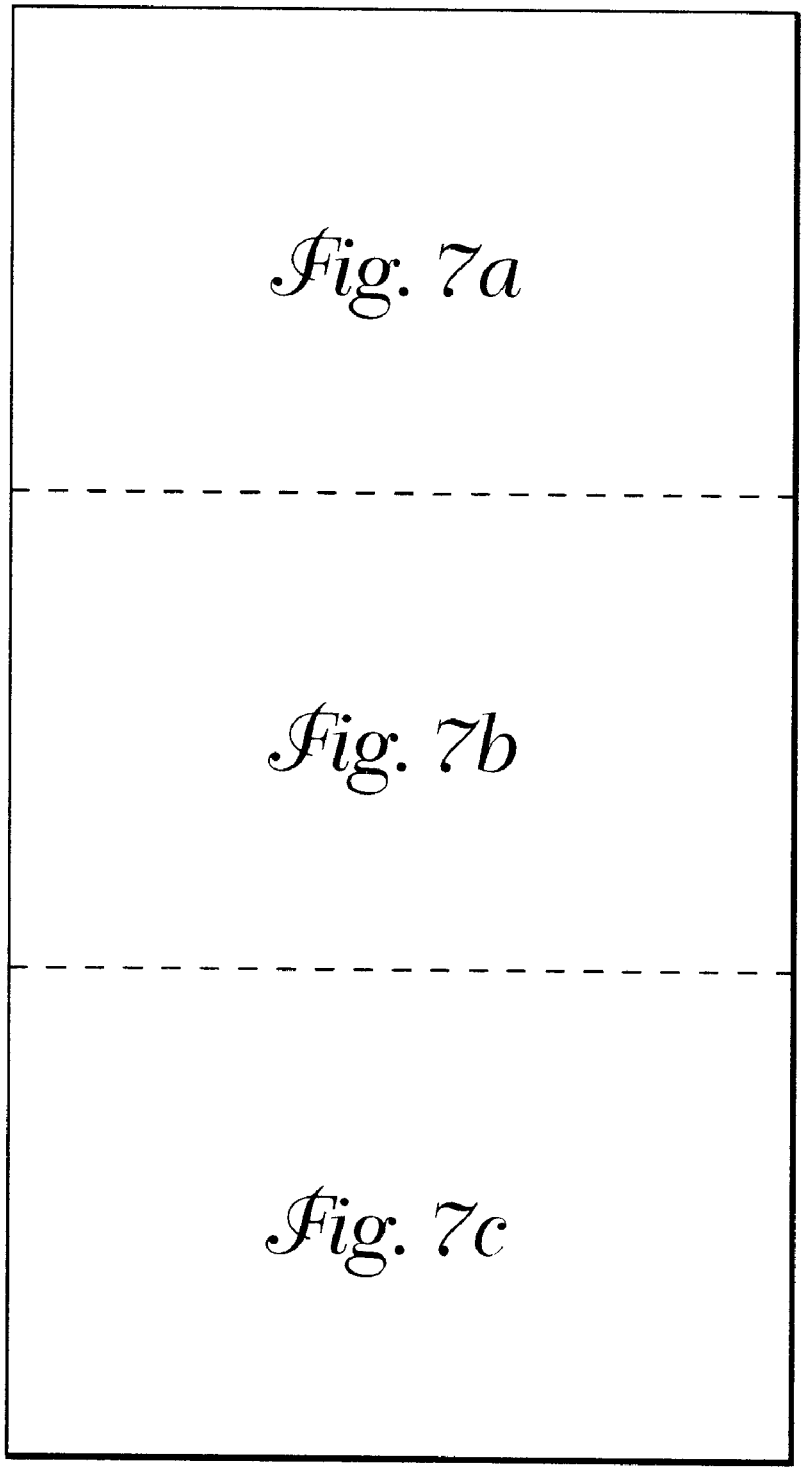
FIG. 7 is a more detailed schematic diagram of a portion of a non-volatile memory array with a differential sensing circuit.
Figure 7A:
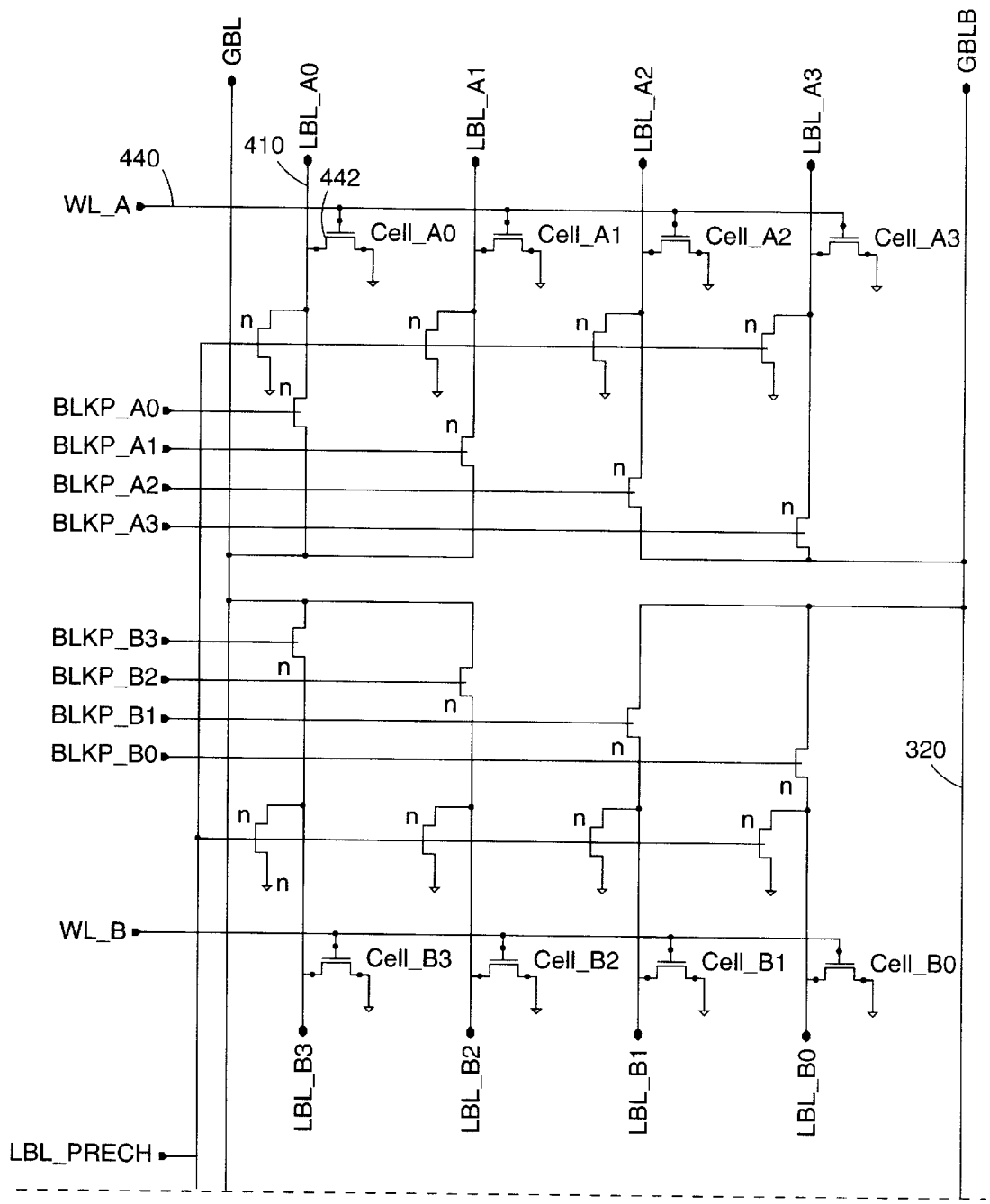
Figure 7B:
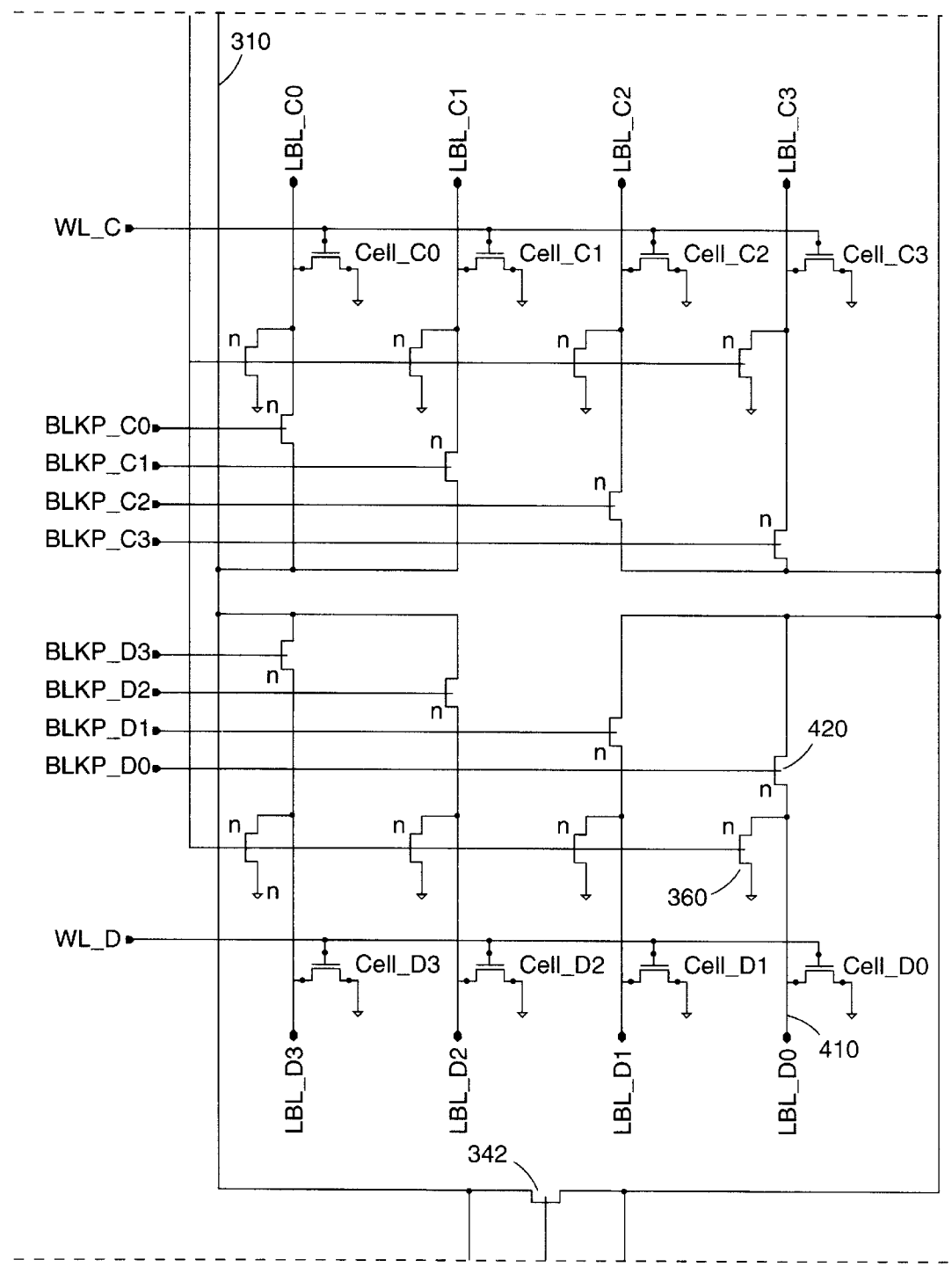
Figure 7C:
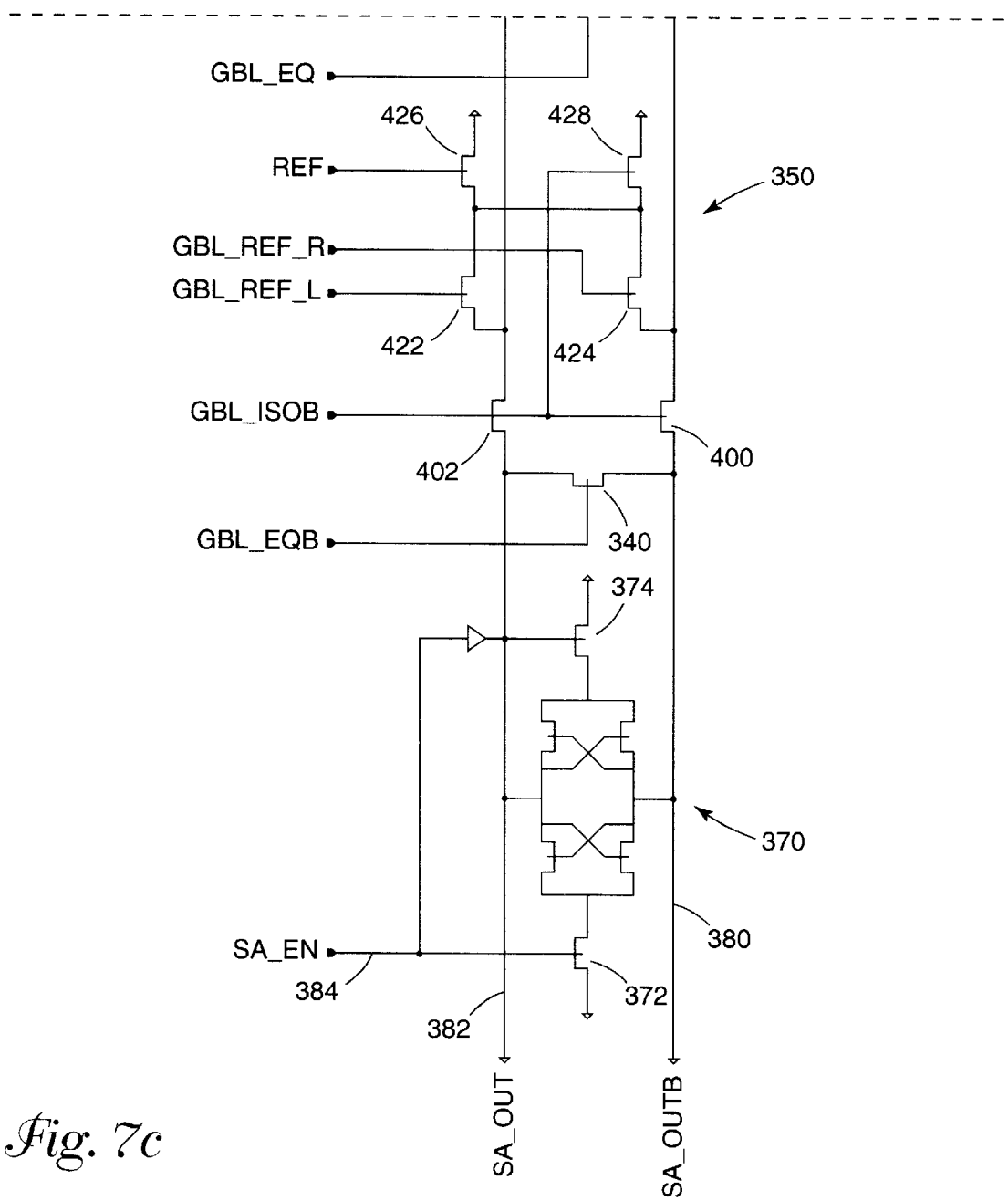

Embodiments of the present invention provide methods and circuits for reading non-volatile memory cells using differential voltage sensing circuitry. A schematic diagram of a portion of a memory array is illustrated in FIG. 7. In addition to the local bit lines, global bit lines and block pass transistors described above, the array includes equilibrate circuitry 340 and 342, pre-charge circuitry 350, local bit line discharge circuitry 360, and a differential sense amplifier 370. The sense amplifier is a cross-coupled differential sense amplifier having an n-channel enable transistor 372 and a p-channel enable transistor 374. During operation, a differential voltage on the sense amplifier sensing nodes 380 and 382 is detected and amplified to Vcc and Vss. When the enable transistors 372 and 374 are turned off in response to an enable signal on line 384, the cross-coupled p-channel and n-channel transistors do not change a voltage on the sensing nodes. That is, the sensing nodes 380 and 382 are floating.

Isolation transistors 400 and 402 are provided between the sense amplifier 370 and the global bit lines 310 and 320 to selectively isolate the sense amplifier from the global bit lines. The pre-charge circuitry 350 is coupled to the global bit lines to provide an initial charge on the global bit lines, as explained below. The pre-charge circuitry is also used to provide a reference current during read operations. The equilibrate circuitry includes a transistor 340 coupled between the sense amplifier sensing nodes and a transistor 342 coupled between the global bit lines. Discharge transistors 360 are coupled to each local bit line 410 to stabilize the local bit lines to Vss prior to charge sharing with the global bit lines.

Figures 8, 8A, 8B:
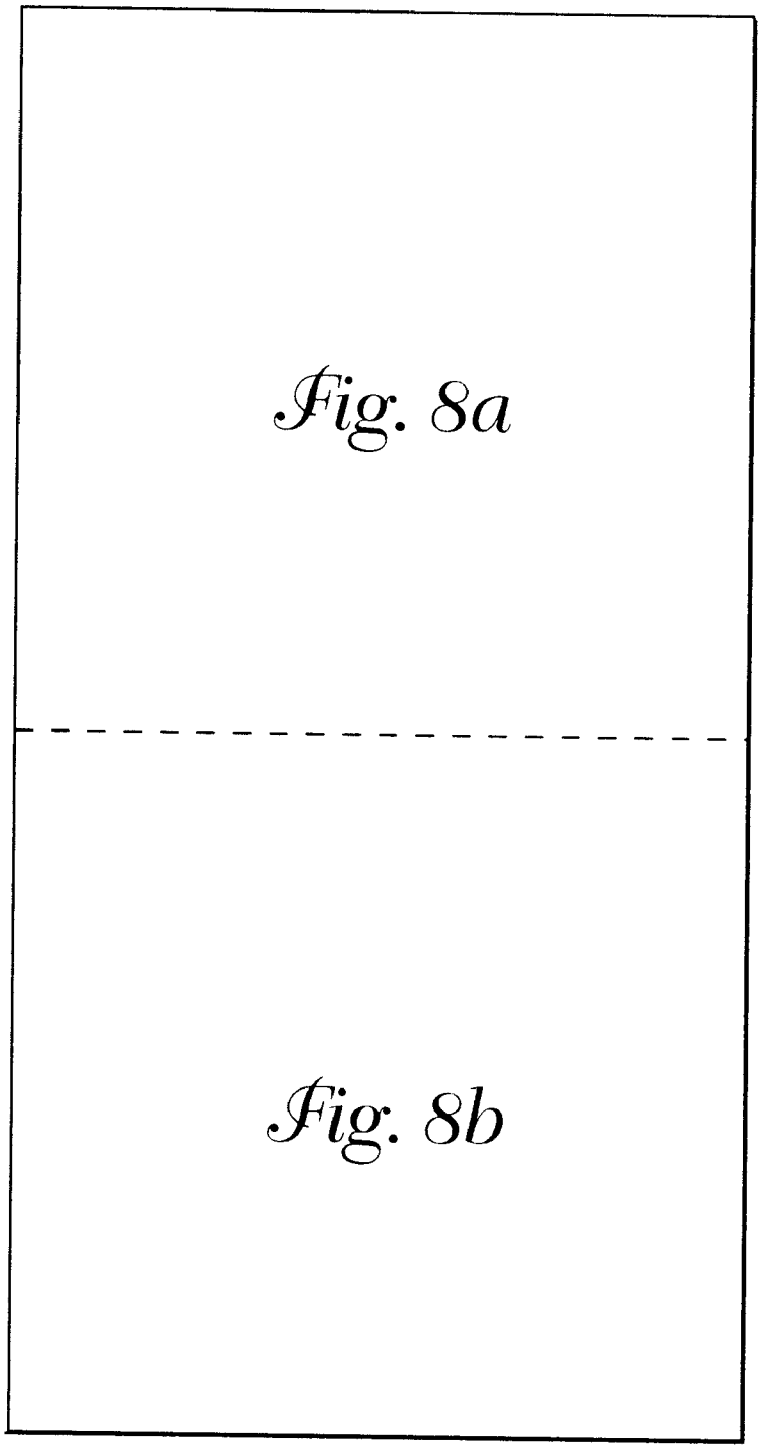
FIG. 8 is a timing diagram of a method of reading a non-volatile memory cell using differential voltage sensing.
Figure 8A:
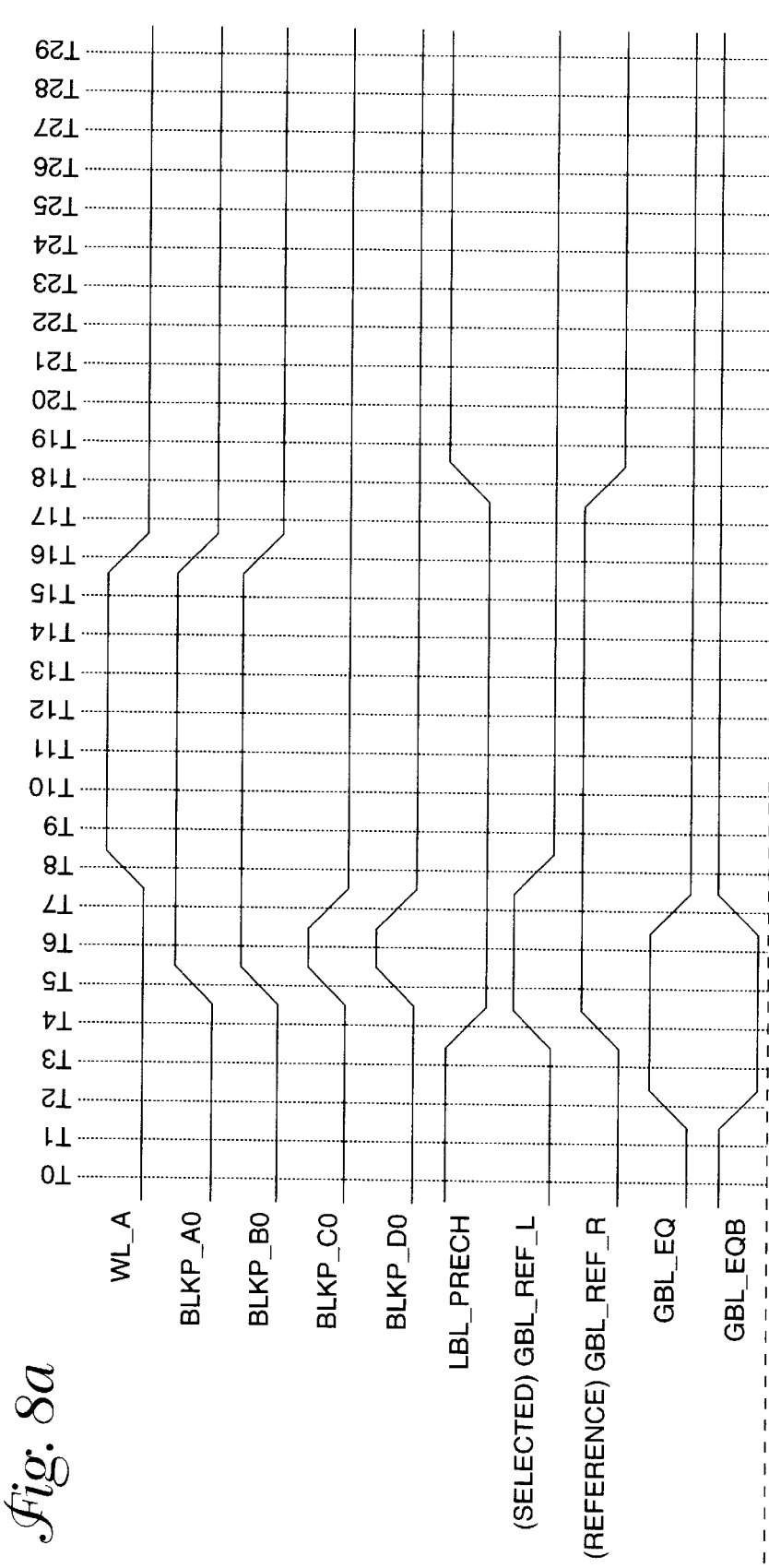
Figure 8B:
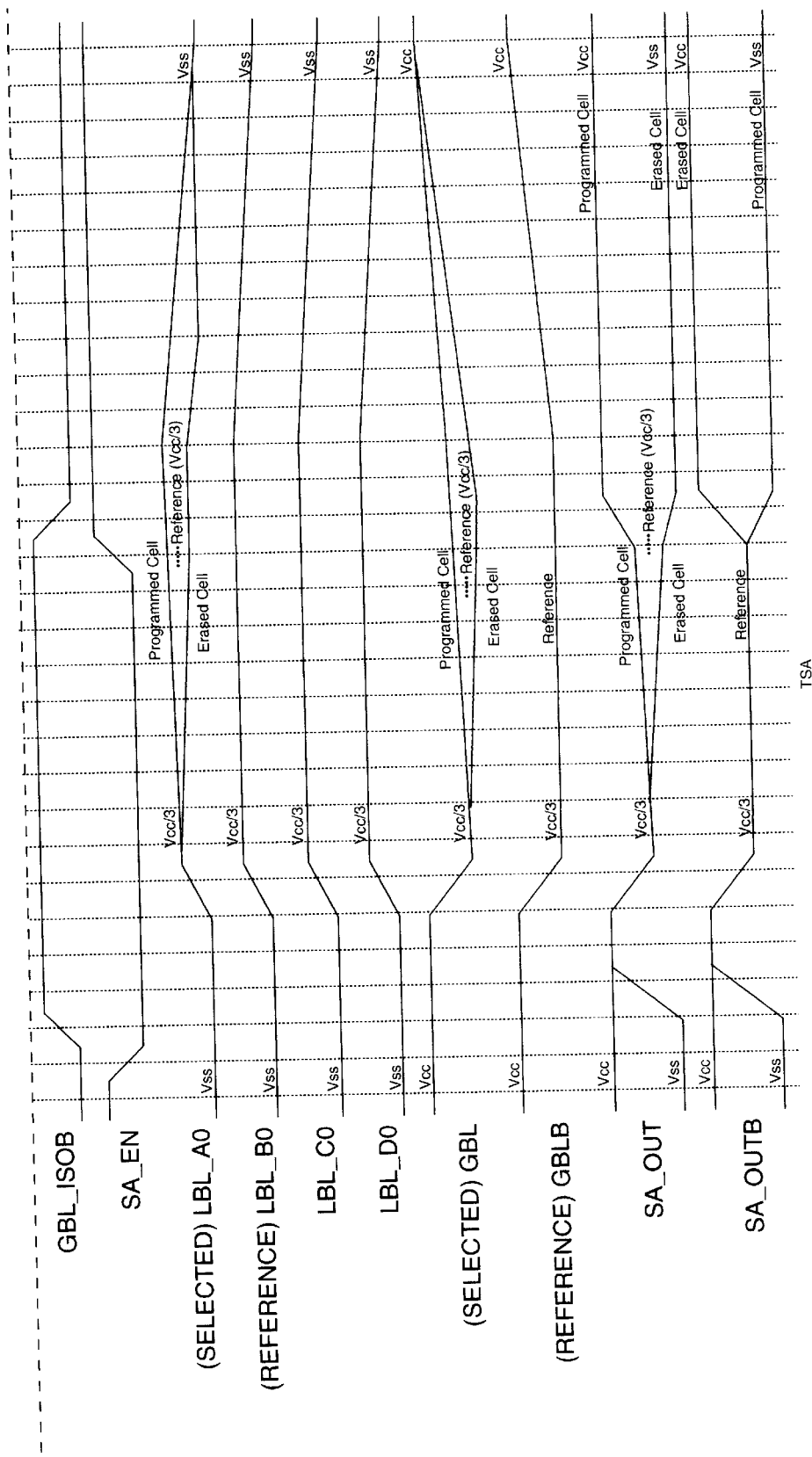

Referring to the timing diagram of FIG. 8, one method of reading data is described. At time T0, all block pass transistors 420 are turned off and the local bit line discharge transistors 360 are activated. This process couples the local bit lines 410 to Vss. Both equilibrate transistors 340 and 342 are turned off and the pre-charge circuitry 350 is activated to pull the global bit lines 310 and 320 to Vcc. The pre-charge operation is performed by activating both global reference transistors 422 and 424 and p-channel pull-up transistors 426 and 428. At this time, the local bit lines 410 are discharged and the global bit lines 310 and 320 are charged. Between times T0 and T1, the sense amplifier 370 is disabled so the sensing nodes 380 and 382 are floating. Between times T1 and T2 the equilibrate transistors 340 and 342 are activated and the sense amplifier is coupled to the global bit lines by activating the isolation transistors 400 and 402. Both sensing nodes of the sense amplifier are therefore pulled to Vcc. Prior to T4, the local bit line discharge circuitry 360 and the global bit line pre-charge circuitry 350 are turned off. Prior to T5, the selected number of block pass transistors 420 are activated to couple two local bit lines to each global bit line. As such, the global and local bit lines are pre-charged to Vcc/3, see time T7. After the bit lines are stabilized at Vcc/3, two block pass transistors are turned off so that only one local bit line is coupled to each global bit line. The equilibrate transistors 340 and 342 are also turned off. At T8, a word line 440 is activated to read a memory cell 442 and one of the global reference transistors 422 is activated. In this example, word line WL_A is activated to couple a memory cell to global bit line 310. The global bit line reference transistor 422 is also activated to couple the global bit line 310 to a reference current provided by the reference pull-up transistor 426.

If the memory cell is programmed, it will not conduct current in response to the word line signal. That is, programming the floating gate has increased the threshold voltage for the memory cell. The selected global bit line 310, therefore, will be charged by the reference current to a value higher than Vcc/3. If the memory cell is erased, it will conduct current in response to the word line signal and the selected global bit line 310 will be discharged to a level that is less than Vcc/3. It is important to note that the reference current is selected so that an erased memory cell will conduct more current than the current sourced by the reference current circuit 422 and 426. For example, the absolute value of the erases cell current may be selected to be twice the absolute value of the reference current. At time T 15 there is a differential voltage developed between the two sensing nodes 380 and 382 and the sense amplifier circuit 370 is activated to drive the sense amplifier nodes to Vcc and Vss. As noted above, the pre-charge levels and the timing of the sense amplifier activation can be selected to reduce drain disturb. That is, a lower pre-charge level reduces a voltage coupled to the memory cells of the local bit lines. The activation timing of the sense amplifier can be selected to change the differential developed on the bit lines, and the isolation transistors 400 and 402 can be turned off prior to driving the sensing nodes to Vcc and Vss.

The sensing technique described above uses two equally pre-charged bit lines 310 and 320 to provide a reference voltage level. A reference current is then coupled to a selected bit line so that a positive differential voltage is provided if a programmed memory cell is coupled to the selected bit line, and a negative differential voltage is provided if an erased memory cell is coupled to the selected bit line.

The above-described differential sensing technique uses equilibrated global bit lines in which a differential voltage is developed after a wordline is activated. The following embodiments use global bit lines that are pre-charged to different voltage levels prior to activating a wordline. Specifically, a selected global bit line is pre-charged to a voltage level that is higher than the reference global bit line. As such, an initial differential voltage is developed that remains if a programmed cell is read. If the read memory cell is erased, the selected global bit line discharges to a level that is less than the reference bit line.

Figure 9A:
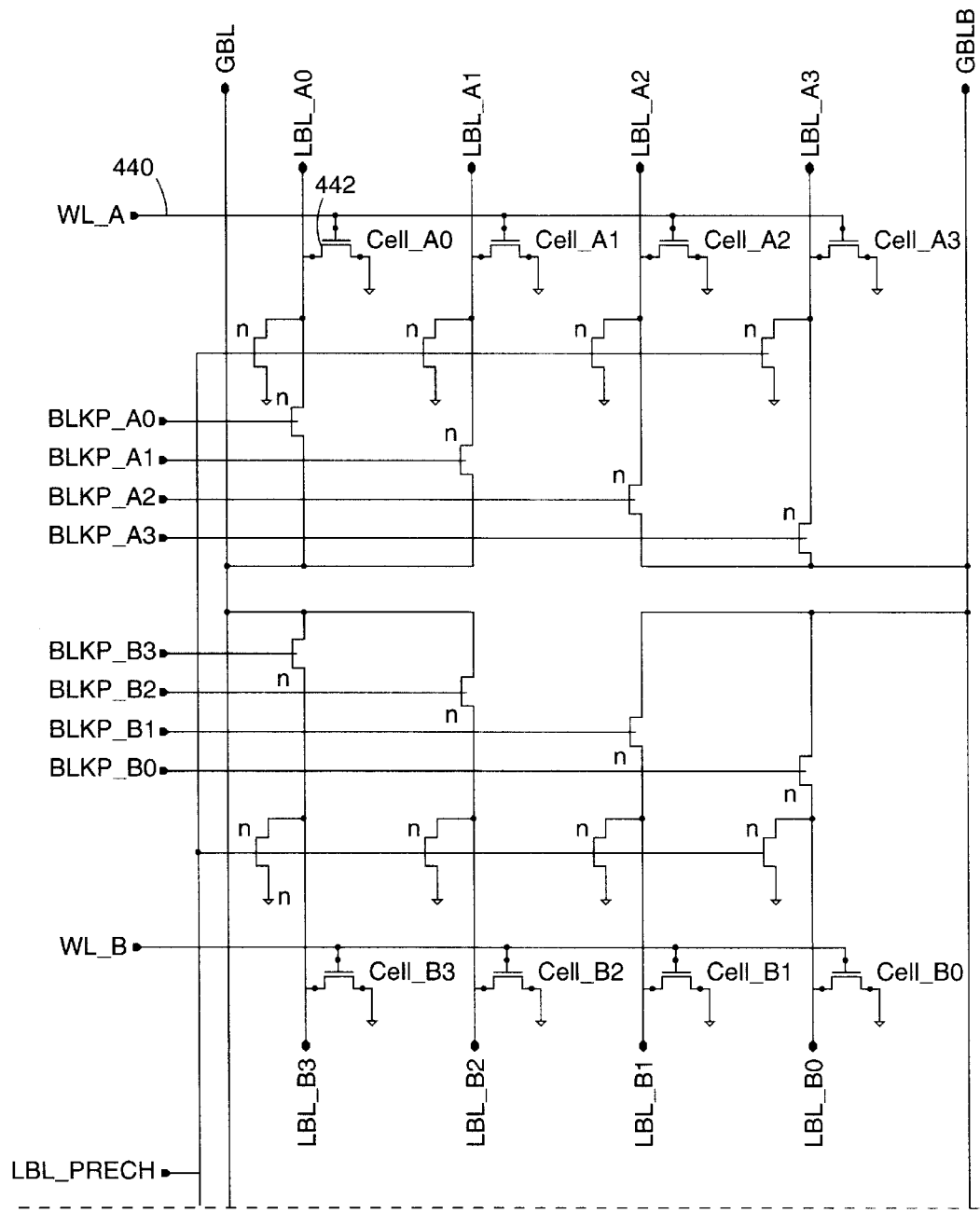
FIG. 9 is another detailed schematic diagram of a portion of a non-volatile memory array with a differential sensing circuit.
Figure 9B:
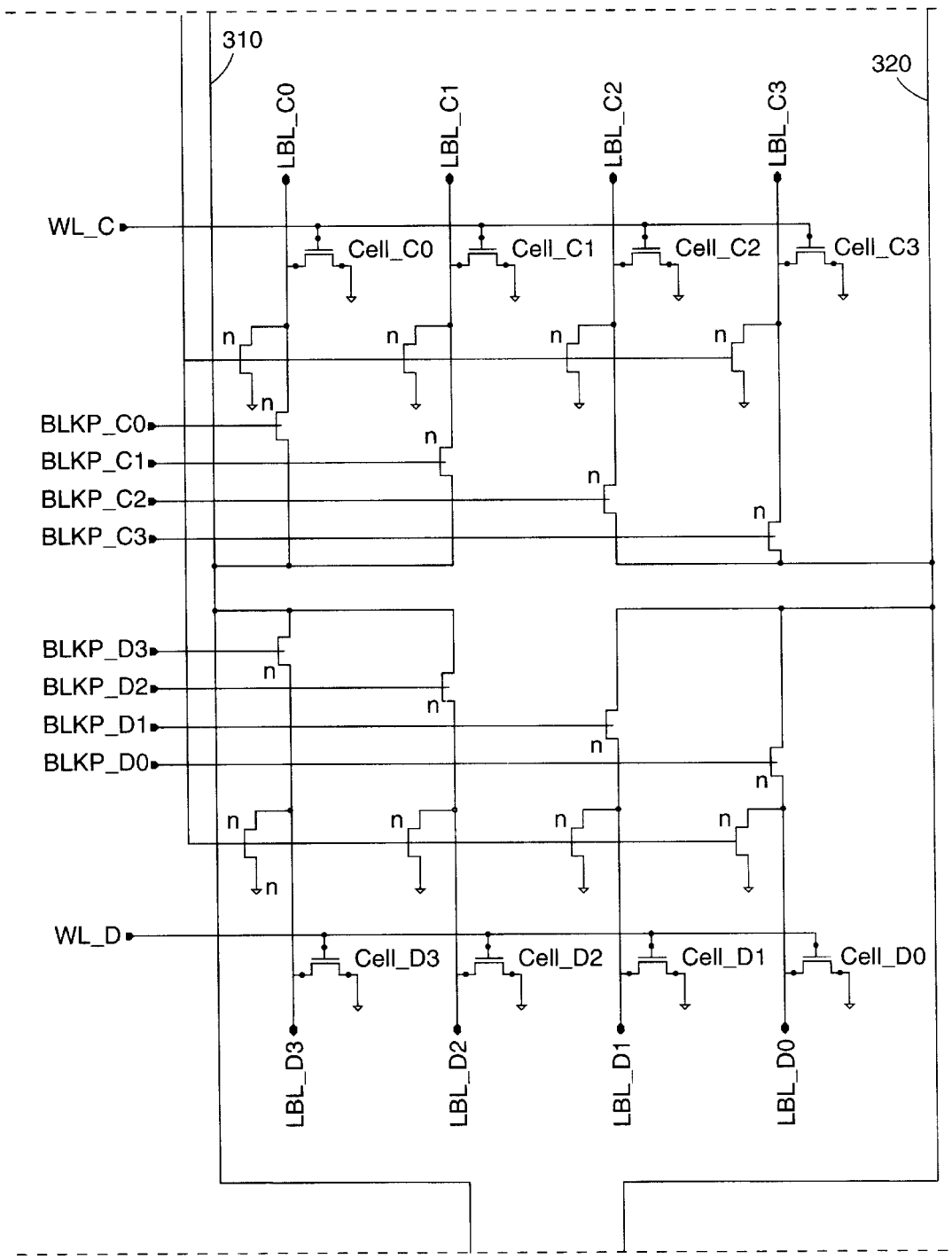
Figure 9C:
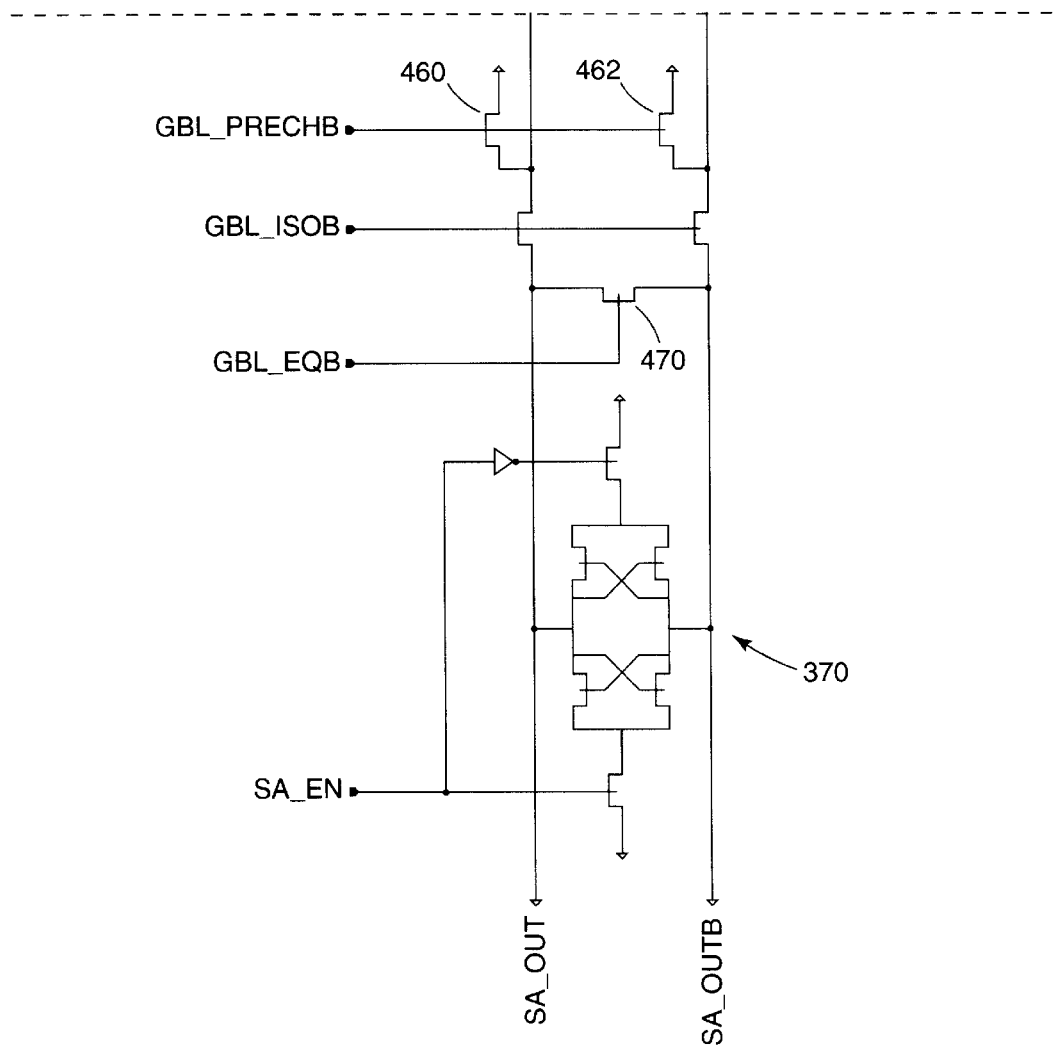
Figures 10, 10A, 10B:
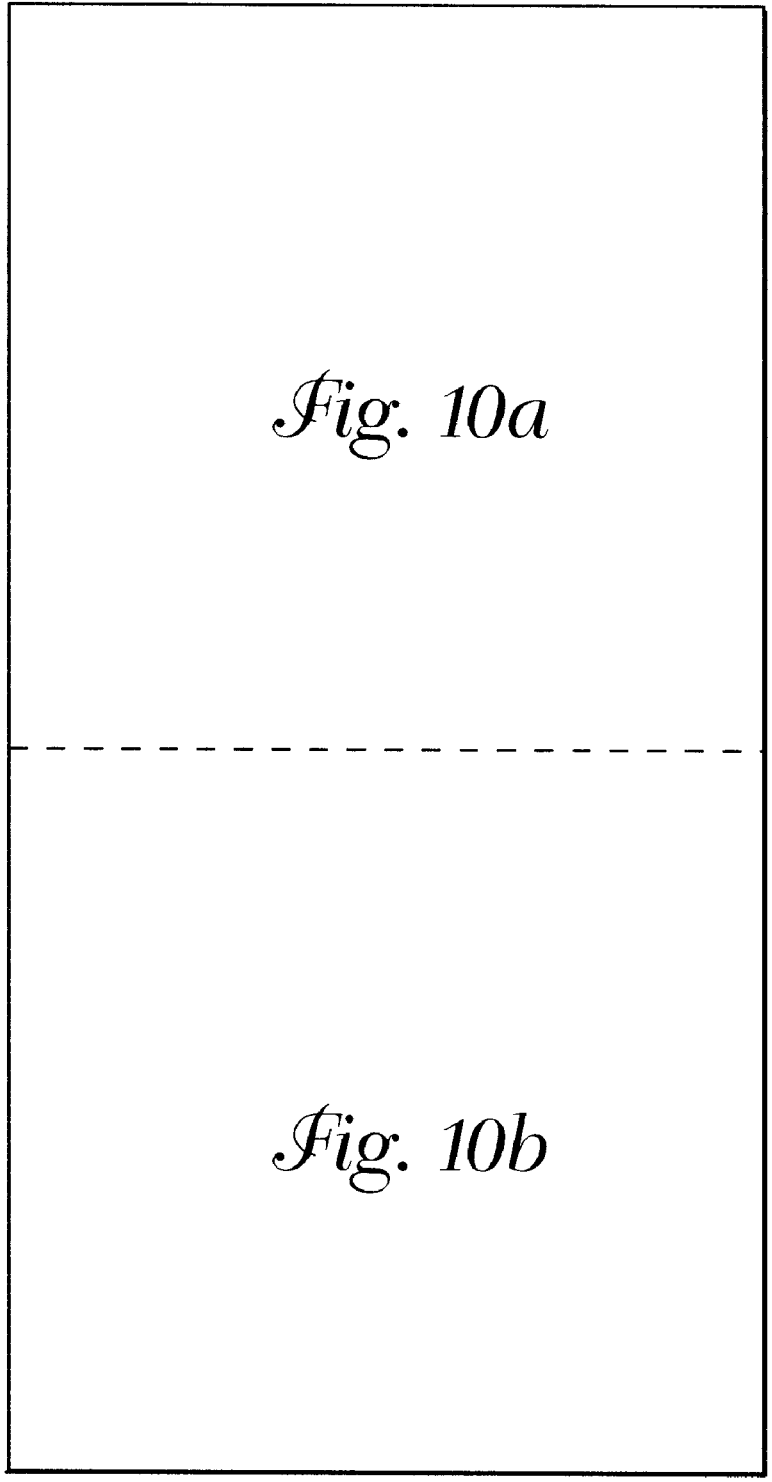
FIG. 10 is a timing diagram of another method of reading a non-volatile memory cell using differential voltage sensing.
Figure 10A:
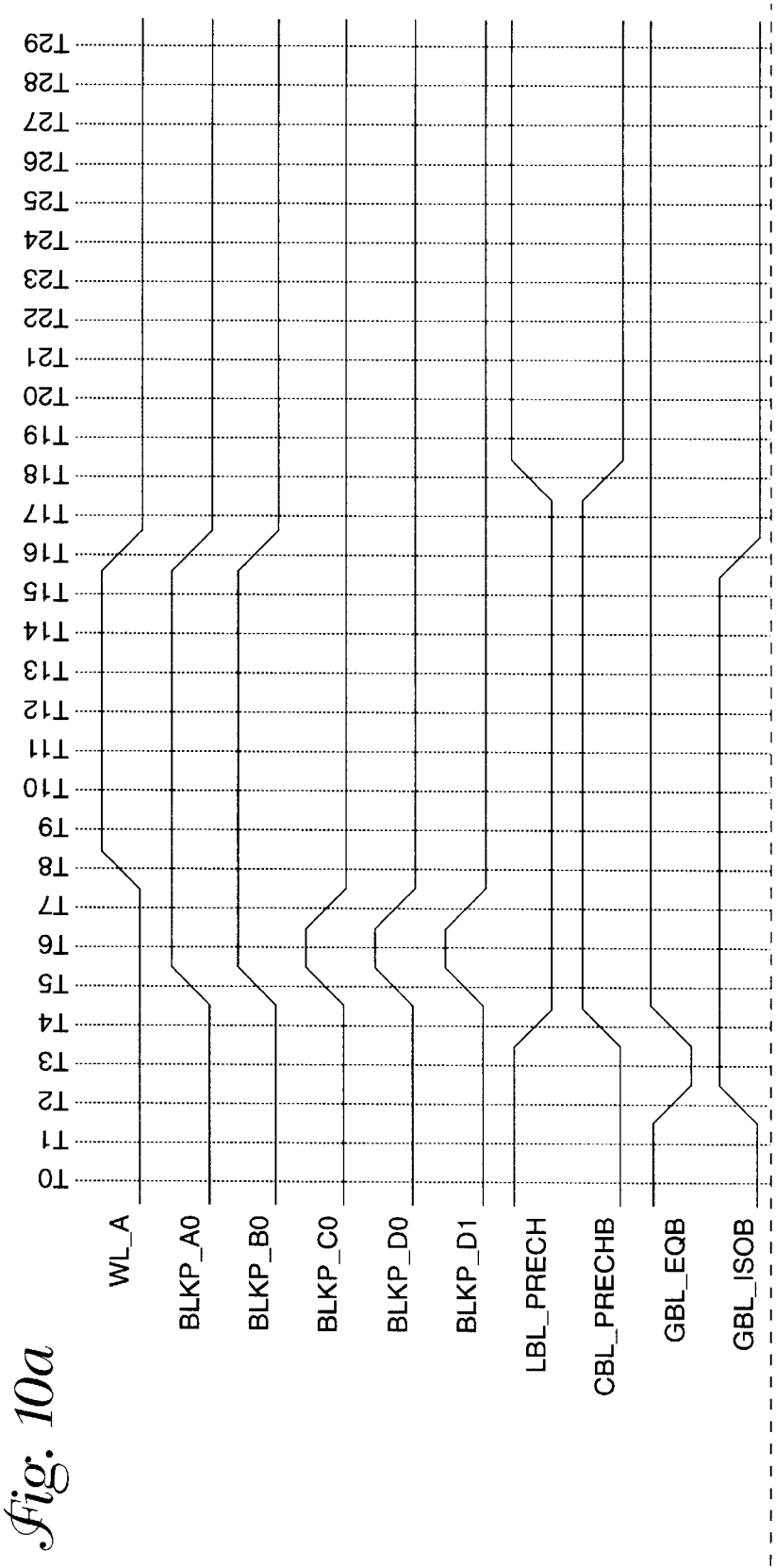
Figure 10B:
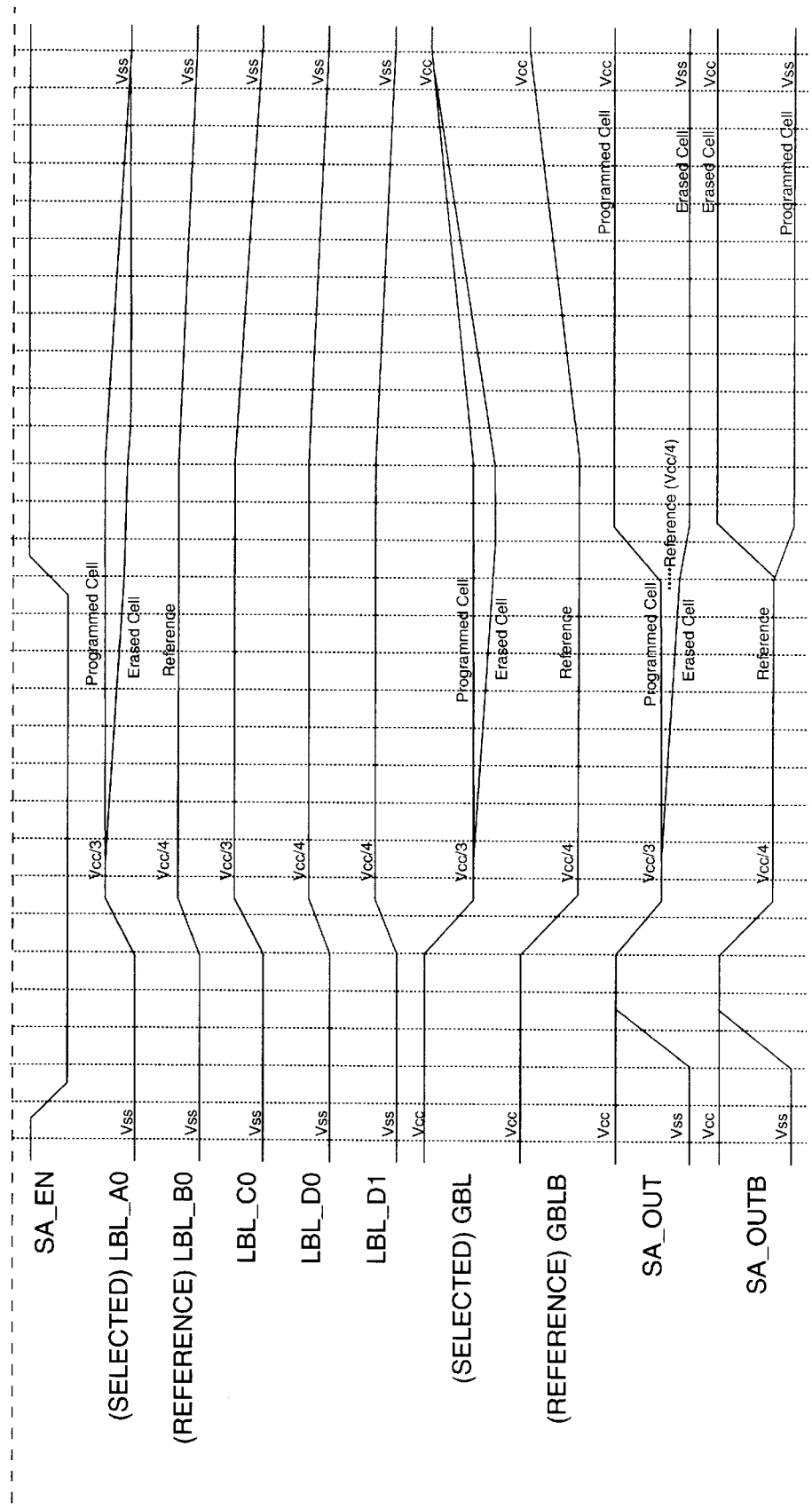

Referring to FIGS. 9 and 10, a differential sensing technique is described. In this embodiment both global bit lines 310 and 320 are pre-charged to different voltage levels. The memory array illustrated in FIG. 9 is substantially the same as the circuit described above with reference to FIG. 7. The pre-charge/reference current circuitry 350, however, has been eliminated, and first and second pull-up transistors 460 and 462 that can be activated to couple the global bit lines to Vcc are provided. A single equilibrate circuit 470 is provided between the sensing nodes of the sense amplifier 370.

One embodiment of operating the circuit of FIG. 9 is described with reference to FIG. 10. At time T0 the local bit lines are discharged to Vss in response to the local bit line pre-charge signal and both global bit lines are charged to Vcc through the pull-up transistors 460 and 462, similar to the method of FIG. 8. At T2, the sense amplifier is coupled to the global bit lines by activating the isolation transistors 400 and 402 and the equilibrate circuit is activated. Thus, the global bit lines and sense amplifier nodes are equilibrated to Vcc from T2 to T4. After T4, the global bit lines are isolated from each other by turning off the equilibrate circuit 470. The pre-charge circuits 460 and 462 are then turned off at T4 and two local bit lines are coupled to the selected global bit line. The selected global bit line 310 is charged shared to a level of Vcc/3. The reference global bit line 320 is coupled to three discharged local bit lines to provide a pre-charge level of Vcc/4. Thus, the present embodiment couples a different number of local bit lines to the global bit lines during pre-charge. The present invention, however, is not limited to two and three local bit lines. That is, the number of local bit lines coupled to the global bit lines can be selected to establish a different desired capacitive ratio. After the pre-charge operation, the number of local bit lines coupled to the global bit lines is reduced so that only one local bit line remains coupled to each of the global bit lines after time T7. Keeping one local bit line coupled to each global bit line maintains a balanced load on each sensing node of the sense amplifier 370.

A word line 440 is activated at T8 to read a memory cell 442. If the memory cell is programmed, the selected global bit line stays substantially at Vcc/3. If the memory cell is erased, the selected global bit line is discharged toward Vss and below Vcc/4. After the reference global bit line is stabilized at Vcc/4 and a differential voltage is developed between the sensing nodes, the sense amplifier is activated (T15). The selected bit line will have a positive differential with the reference bit line if the memory cell is programmed, or the selected bit line will have a negative differential if the memory cell is erased.

The above-described embodiment uses a single pre-charge cycle to establish pre-charge levels on the sense amplifier nodes that have an initial differential level. During a read operation, the memory cell either leaves the initial differential voltage or switches the differential direction. An alternate embodiment that uses two pre-charge cycles to establish an initial differential is described below.

Figures 11, 11A, 11B:
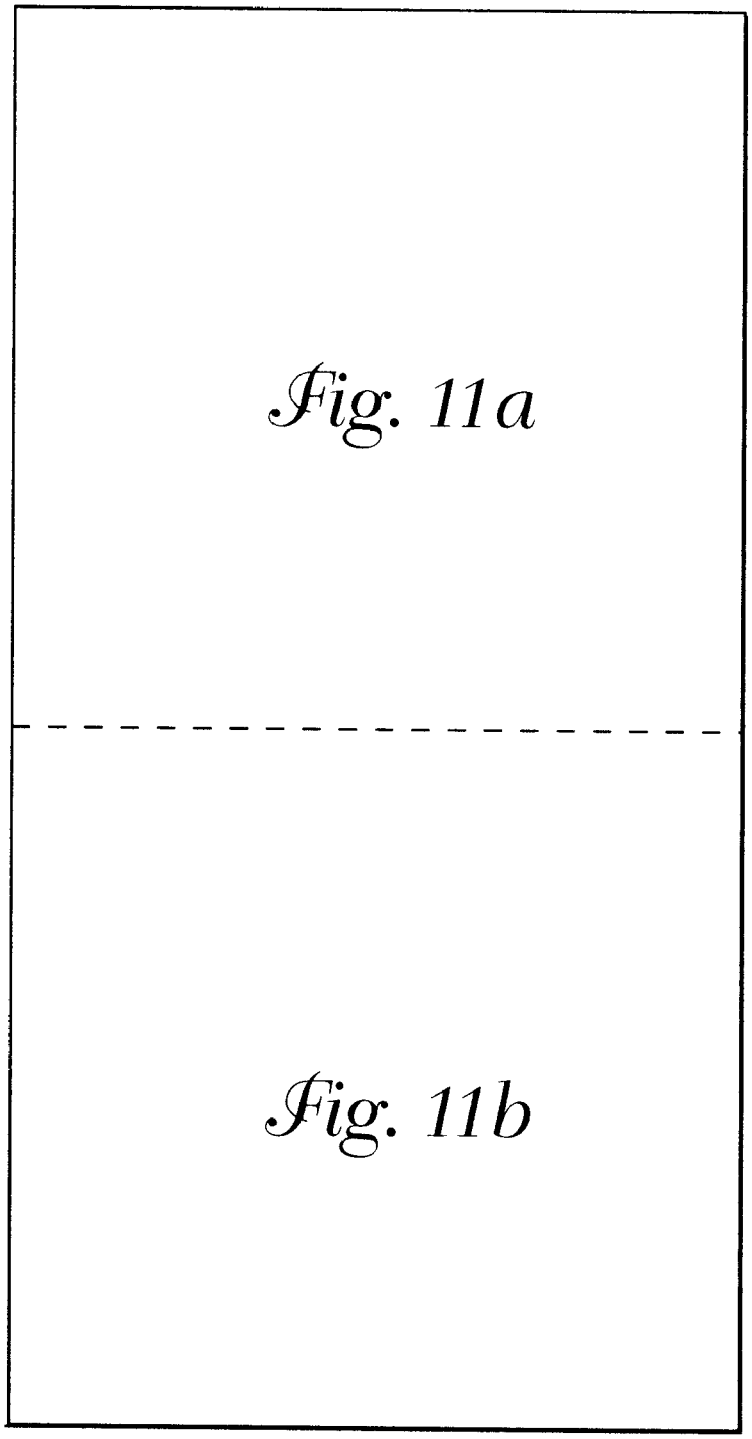
FIG. 11 is a timing diagram of another method of reading a non-volatile memory cell using differential voltage sensing.
Figure 11A:
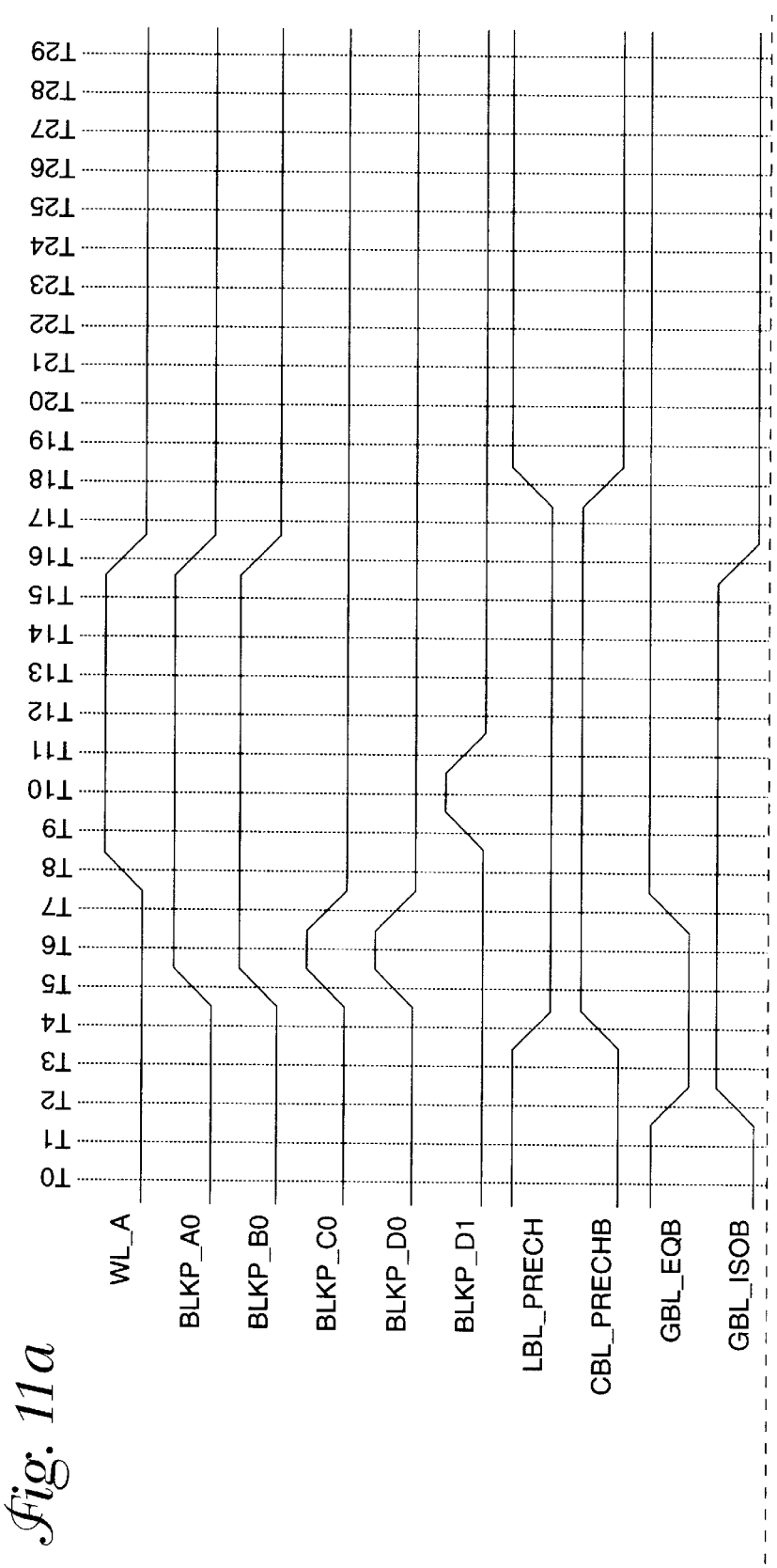
Figure 11B:
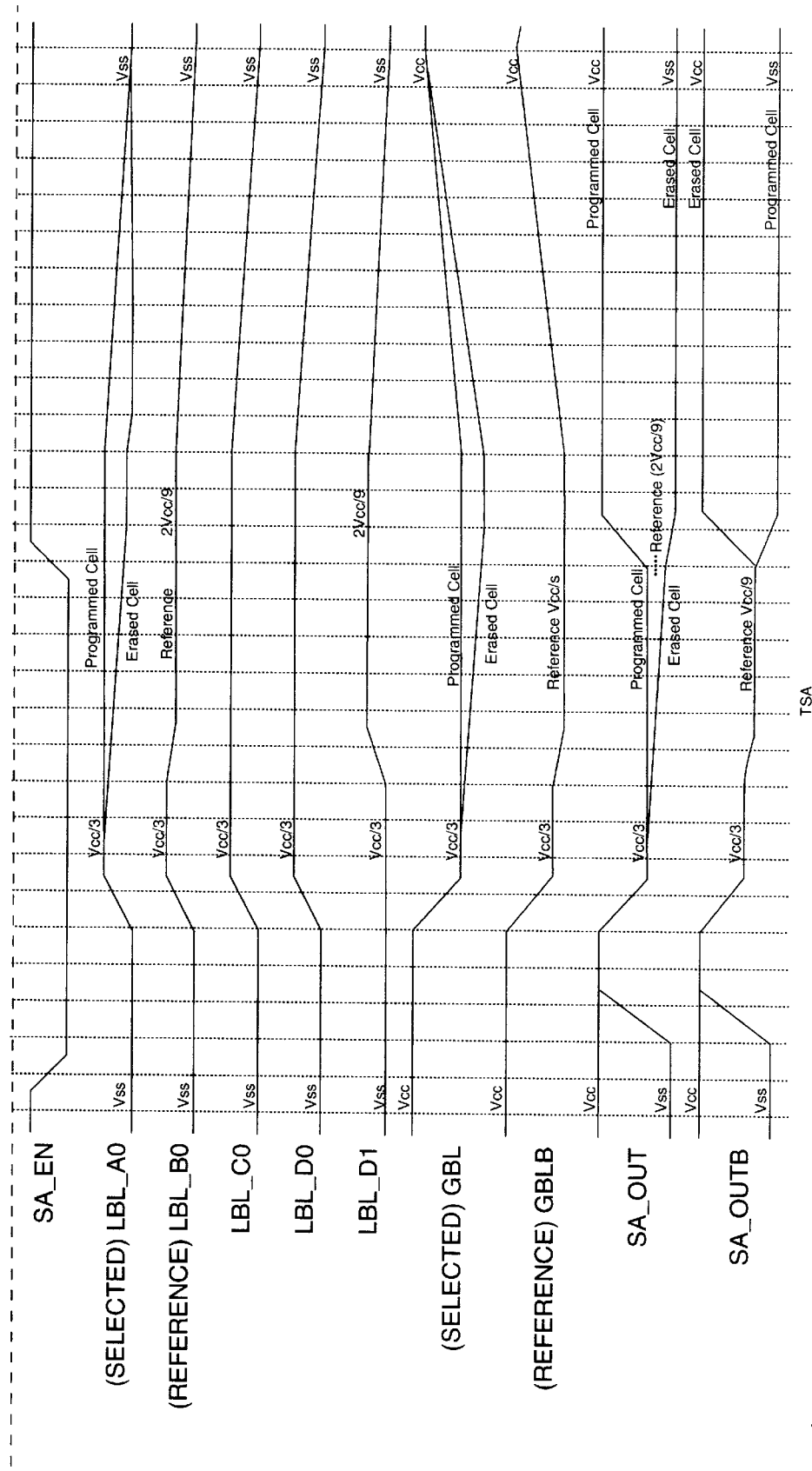

Referring to FIGS. 9 and 11, a two cycle pre-charge technique is described using the same array circuitry explained above. In this embodiment both global bit lines are pre-charged to a common voltage level, such as Vcc/3, during a first cycle. The reference bit line is then charge shared, during a second cycle, with an additional discharged local bit line(s) to reduce the reference pre-charge to a lower level, such as 2Vcc/9.

One embodiment of operating the circuit of FIG. 9 is illustrated in FIG. 1. At time T0 the local bit lines are discharged to Vss in response to the local bit line pre-charge signal and both global bit lines are charged to Vcc through the pull-up transistors, as explained above. At T2, the sense amplifier 370 is coupled to the global bit lines 310 and 320 by activating the isolation transistors 400 and 402 and the equilibrate circuit 470 is activated. The global bit lines and the sense amplifier nodes, therefore, are all charged to Vcc. The pre-charge circuits 460 and 462 are turned off and two local bit lines are coupled to each global bit line. The global bit lines, four local bit lines and the sense amplifier nodes are all charged shared and equilibrated to a level of Vcc/3. At T7, the equilibrate circuit 470 is turned off and two of the local bit lines are isolated (one from each global bit line). Note that one local bit line remains coupled to the global bit lines at time T7. From T9 to T12 a third discharged local bit line is coupled to the reference global bit line 320. The reference global bit line and its associated sensing node are then charged shared to 2Vcc/9. That is, the reference global bit line and one local bit line are first charged to Vcc/3 during one charge sharing cycle. By coupling a third bit line during a second charge sharing cycle, and after one bit line has been decoupled, the capacitance is increased by ⅓ (from two bit lines to three bit lines) and the voltage is reduced by ⅓ to 2Vcc/9.

During the second pre-charge cycle on the reference global bit line 320, a word line 440 is activated to read a memory cell 442 coupled to the selected global bit line 310. If the memory cell is programmed (higher threshold voltage), the selected global bit line stays substantially at Vcc/3. If the memory cell is erased (lower threshold voltage), the selected global bit line is discharged toward Vss. After the reference global bit line is stabilized at 2Vcc/9 and the proper differential voltage is developed between the sensing nodes, the sense amplifier is activated (T15). The selected bit line has a positive differential voltage with respect to the reference bit line if the memory cell is programmed, or a negative differential voltage if the memory cell is erased.

The above-described embodiment uses a two-cycle pre-charge technique to establish pre-charge levels on the sense amplifier nodes that have an initial differential level. The memory cell either leaves the initial differential voltage or switches the differential direction. The two-cycle technique provides two charge sharing periods to establish a lower reference level. The number of local bit lines used to establish the pre-charge levels can be changed and the present invention is not limited to the example described.

An alternate two-step technique pre-charges the selected global bit line and the sense amplifier nodes to Vcc, and the reference global bit line and the local bit lines are discharged to Vss. Coupling the selected local bit line to its global bit line will result in a value of approximately Vcc/2. The reference global bit line is charge shared with the reference node of the sense amplifier and a voltage that is less than Vcc/2 is established. Other embodiments will be understood by those skilled in the art with the benefit of the present description.

Conclusion

A non-volatile memory device has been described that can read data stored in non-volatile memory cells using a differential voltage sensing technique. The memory includes a differential voltage sensing circuit having two input nodes. The nodes of the sensing circuit are pre-charged to different initial voltage levels prior to reading the memory cell. The nodes are pre-charged by charge sharing multiple bit lines. A selected node that is coupled to a memory cell to be read is pre-charged to a higher value than the second sensing node. After a word line coupled to the memory cell is activated, the initial differential voltage between the sensing nodes will remain if the memory cell is programmed such that it does not conduct current in response to the word line signal. If the memory cell is not programmed, the memory cell will discharge the selected sensing node to provide a different differential voltage to be sensed.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory comprising:
   an array of memory cells;
   a differential voltage sensing circuit having first and second sensing nodes couplable to the array; and
   pre-charge circuitry to provide a first pre-charge voltage level on the first sensing node while providing a second pre-charge voltage level on the second sensing node, such that the first and second sensing nodes maintain a differential voltage prior to reading a memory cell.

2. The memory of claim 1 further comprising local bit lines coupled to the array of memory cells and global bit lines coupled to the first and second sensing nodes.

3. The memory of claim 2 further comprising selectively controllable pass circuitry coupled to the local bit lines and the global bit lines to selectively couple one or more local bit lines to the global bit lines.

4. The memory of claim 1 wherein the differential voltage sensing circuit can be selectively deactivated to conserve power consumption.

5. A memory comprising:
   an array of memory cells;
   a differential voltage sensing circuit having first and second sensing nodes couplable to the array;
   local bit lines coupled to the array of memory cells and global bit lines coupled to the first and second sensing nodes;
   selectively controllable pass circuitry coupled to the local bit lines and the global bit lines to selectively couple one or more local bit lines to the global bit lines; and
   pre-charge circuitry to provide a first pre-charge voltage level on the first sensing node while providing a second pre-charge voltage level on the second sensing node, wherein the pre-charge circuitry comprises pull-down circuitry to discharge the local bit lines, and pull-up circuitry to charge the global bit lines.

6. The memory of claim 5 further comprises control circuitry to selectively couple a first pre-defined number of local bit lines to a first global bit line coupled to the first sensing node, and selectively couple a second pre-defined number of local bit lines to a second global bit line coupled to the second sensing node, wherein the second pre-defined number of local bit lines is less than the first pre-defined number.

7. A memory comprising:
   an array of memory cells;
   a differential voltage sensing circuit having first and second sensing nodes couplable to the array;
   pre-charge circuitry to provide a first pre-charge voltage level on the first sensing node while providing a second pre-charge voltage level on the second sensing node;
   a first isolation device located between the array and the second sensing node; and a second isolation device located between the array and the first sensing node.

8. The memory of claim 1 wherein the differential voltage sensing circuit comprises first and second latches.

9. A memory comprising:
an array of memory cells;
a differential voltage sensing circuit having first and second sensing nodes couplable to the array, the differential voltage sensing circuit comprises first and second latches, wherein the first latch comprises cross-coupled p-channel transistors, and the second latch comprises cross-coupled n-channel transistors; and
pre-charge circuitry to provide a first pre-charge voltage level on the first sensing node while providing a second pre-charge voltage level on the second sensing node.

10. The memory of claim 9 wherein the first latch is activated prior to activating the second latch.

11. A flash memory device comprising:
an array of non-volatile memory cells connected to a plurality of first capacitive bit lines;
a differential voltage sensing circuit having first and second sensing nodes couplable to second and third capacitive bit lines, respectively;
pass circuitry coupled between the plurality of first bit lines and the second and third bit lines;
pre-charge circuitry to provide a first pre-charge voltage level on the plurality of first bit lines, and provide a second pre-charge voltage level on the second and third bit lines; and
control circuitry coupled to the pass circuitry to selectively couple a first set of the plurality of first bit lines to the second bit line, and selectively couple a second set of the plurality of first bit lines to the third bit line.

12. The flash memory of claim 11 wherein the pre-charge circuitry comprises:
pull-down circuitry coupled to the plurality of first bit lines to couple the plurality of first bit lines to a ground potential; and
pull-up circuitry coupled to the second and third bit lines to couple the first and second bit lines to an upper supply potential.

13. The flash memory of claim 11 wherein the first set is two of the plurality of first bit lines, and the second set is three of the plurality of first bit lines.

14. The flash memory device of the claim 11 further comprising:
a first isolation device located between the second capacitive bit line and the first sensing node; and
a second isolation device located between the third capacitive bit line and the second sensing node.

15. The flash memory device of claim 11 wherein the differential voltage sensing circuit comprises first and second latches.

16. The flash memory device of claim 15 wherein the first latch comprises cross-coupled p-channel transistors, and the second latch comprises cross-coupled n-channel transistors.

17. The flash memory device of claim 16 wherein the first latch is activated prior to activating the second latch.

18. The flash memory device of claim 11 wherein the differential voltage sensing circuit can be selectively deactivated to conserve power consumption.

19. A method of operating a memory device comprising:
pre-charging a first sensing node of a differential voltage sensing circuit to a first voltage level;
pre-charging a second sensing node of the differential voltage sensing circuit to a second voltage level that is less than the first voltage level;
providing a read signal to a memory cell coupled to the first sensing node; and
discharging the first sensing node to a third voltage level that is less than the second voltage level if the memory cell is not programmed.

20. The method of claim 19 wherein pre-charging the first sensing node comprises coupling a first bit line charged to an upper supply voltage to a plurality of second bit lines discharged to ground potential.

21. The method of claim 20 wherein the plurality of second bit lines comprises one, two, three or four second bit lines.

22. The method of claim 20 wherein pre-charging the second sensing node comprises coupling a third bit line charged to an upper supply voltage to a plurality of fourth bit lines discharged to ground potential, wherein the plurality of fourth bit lines is less than the plurality of second bit lines.

23. The method of claim 22 wherein the plurality of second bit lines comprises two, three or four second bit lines.

24. The method of claim 19 wherein the first voltage level is Vcc/2, where Vcc is an upper voltage supply level, and the second voltage level is Vcc/3.

25. A method of reading a memory cell comprising:
discharging local bit lines to ground potential;
charging first and second global bit lines to an upper supply voltage level, Vcc;
coupling a first predefined number of the local bit lines to the first global bit line such that a first intermediate voltage level is established on the first global bit line via charge sharing;
coupling a second predefined number of the local bit lines to the second global bit line such that a second intermediate voltage level is established on the second global bit line via charge sharing, wherein the second predefined number is greater than the first predefined number;
providing a read signal to the memory cell coupled to the first global bit line; and
detecting a differential voltage between the first and second global bit lines after the read signal is provided.

26. The method of claim 25 wherein the first predefined number is one, two, three or four local bit lines.

27. The method of claim 26 wherein the second predefined number is two, three or four local bit lines.

28. The method of claim 25 wherein coupling the first predefined number of the local bit lines and coupling the second predefined number of the local bit lines are performed substantially simultaneously.

29. A method of reading a memory cell comprising:
pre-charging first and second sensing nodes of a differential voltage sensing circuit to first and second voltage levels, respectively, wherein the second voltage level is less than the first voltage level;
providing a read signal to the memory cell coupled to the first sensing node while the first and second sensing nodes are at the first and second differential voltage levels; and
detecting a differential voltage between the first and second sensing nodes after the read signal is provided.

30. The method of claim 29 wherein pre-charging the first and second sensing nodes is performed substantially simultaneously via a charge sharing operation.

31. The method of claim 30 wherein the charge sharing operation is performed using capacitive bit lines coupled to the differential sensing circuit.

* * * * *

UNITED STATES PATENT AND TRADEMARK OFFICE
CERTIFICATE OF CORRECTION

PATENT NO.    : 6,507,525 B1
DATED         : January 14, 2003
INVENTOR(S)   : Dean Nobunaga It is certified that error appears in the above-identified patent and that said Letters Patent is hereby corrected as shown below:

Column 6,
Line 50, replace "228" with -- 218 --

Signed and Sealed this

Fifth Day of August, 2003

JAMES E. ROGAN
*Director of the United States Patent and Trademark Office*